US007236600B1

(12) United States Patent
Bonneville

(10) Patent No.: US 7,236,600 B1
(45) Date of Patent: Jun. 26, 2007

(54) TRANSMISSION OF POWER AND/OR SIGNALLING BETWEEN AN AUDIO DISTRIBUTION UNIT AND A PLURALITY OF REMOTE AUDIO TRANSDUCERS

(75) Inventor: Marc Etienne Bonneville, Cumberland (CA)

(73) Assignee: Paradigm Electronics Inc., Mississauga (CA)

( * ) Notice: Subject to any disclaimer, the term of this patent is extended or adjusted under 35 U.S.C. 154(b) by 1081 days.

(21) Appl. No.: 09/667,434

(22) Filed: Sep. 22, 2000

(30) Foreign Application Priority Data

Sep. 23, 1999 (CA) .................................... 2283577

(51) Int. Cl.
*H04B 3/00* (2006.01)
*H03G 3/00* (2006.01)
(52) U.S. Cl. ........................................ 381/77; 381/105
(58) Field of Classification Search ................ 381/104, 381/98, 77, 79, 80, 81, 82, 105
See application file for complete search history.

(56) References Cited

U.S. PATENT DOCUMENTS

| | | | |
|---|---|---|---|
| 4,509,211 A | 4/1985 | Robbins ...................... | 455/603 |
| 4,885,803 A | 12/1989 | Hermann et al. ............ | 455/603 |
| 5,222,150 A * | 6/1993 | Tajima ........................ | 381/105 |
| 5,297,211 A * | 3/1994 | Noro ............................ | 381/81 |
| 5,406,634 A * | 4/1995 | Anderson et al. ............ | 381/82 |
| 6,389,139 B1 * | 5/2002 | Curtis et al. .................. | 381/105 |
| 6,449,348 B1 * | 9/2002 | Lamb et al. ............. | 379/93.36 |
| 6,492,909 B1 * | 12/2002 | Washikawa et al. ... | 340/825.25 |

OTHER PUBLICATIONS

QED Audio Products Ltd., Systemline Installation Manual, Mar. 1989, Issue One.*

* cited by examiner

*Primary Examiner*—Xu Mei
(74) *Attorney, Agent, or Firm*—Thomas Adams

(57) ABSTRACT

A remote-controlled audio system comprises sets of loudspeakers (14A-14D) connected to power amplifier units (22A-22D) in an audio distribution unit (10) to which several audio sources, such as a compact disc unit, a tape deck, etc., are connected. Remote units (34) are provided, one in each zone with a set of loudspeakers. The loudspeakers and the remote unit are connected to the audio distribution unit by four wires whereby audio and data signals and power are transmitted to the loudspeakers and the remote unit, respectively. Each power amplifier unit may have a pair of power amplifiers, each connected to one of the loudspeakers in the set, referenced to a first ground (1) and a second ground (2), respectively. The second ground (2) is maintained at a prescribed voltage relative to the first ground. The remote unit (34A) is connected between the "ground" terminals of the two loudspeakers of the set, i.e. those connected via the speaker cables to the first and second grounds in the audio distribution unit. The remote unit has a transmitter unit which transmits control signals to the audio distribution unit via the "ground" cables. In the audio distribution unit, an interface circuit connected between the grounds conveys the control signals to a control device which adjusts the settings of the audio distribution unit in dependence thereupon. The remote units may receive power from the audio distribution unit via the transmission channel to supply their internal components.

56 Claims, 10 Drawing Sheets

TRANSMISSION OF POWER AND/OR SIGNALLING BETWEEN AN AUDIO DISTRIBUTION UNIT AND A PLURALITY OF REMOTE AUDIO TRANSDUCERS

BACKGROUND OF THE INVENTION

1. Technical Field

The invention relates to the transmission of power and/or signalling between an audio distribution unit and a plurality of remote audio transducers and is especially applicable to multi-zone audio systems or entertainment centres comprising an audio distribution unit for driving several sets of loudspeakers in different zones, such as different rooms of a house.

2. Background Art

A multi-zone audio/entertainment system may have a plurality of loudspeaker sets, each set located in a different zone, such as a room of a house or other building. Typically, such a system comprises an audio distribution unit having inputs for audio signals from several sources (tuner, CD player, tape player, etc.), output ports for connection to the sets of loudspeakers, and a switching matrix for connecting the sources to respective ones of the loudspeaker sets. Some known systems provide local control of volume by means of an autotransformer, but these are susceptible to distortion, heating and poor frequency response. It is desirable for the user to be able to control settings of the audio distribution unit from the zones where the loudspeakers are located.

It is known to provide remote control of audio source selection, volume and tone control, balance adjustment, and so on, by means of keypad units, one for each zone. Each keypad unit communicates with a microcontroller in the audio distribution unit to provide control of most of its functions. A disadvantage of such systems is that each keypad unit is connected to the audio distribution unit by a multi-conductor cable which comprises some conductors for exchanging control signals between the remote keypad unit and the audio distribution unit, and others for supplying power from the audio distribution unit to the remote keypad unit. It is expensive to provide such multi-conductor cabling for every keypad, and such expense is especially unacceptable when adding remote control to an existing multi-zone loudspeaker system, which usually would require installation of multi-conductor cables in addition to existing two-conductor loudspeaker cables.

It is also known to use wireless communication links between remote control units and an audio distribution unit. Disadvantageously, however, the radio frequency circuitry is relatively expensive and susceptible to interference, and the remote control unit requires a local power supply. Also, speaker drive conductors would usually still be required unless the audio drive also used wireless links. The latter systems either are expensive or deliver poor quality results.

SUMMARY OF THE INVENTION

The present invention seeks to eliminate, or at least mitigate, the disadvantages of these known remote control systems.

According to one aspect of the present invention, there is provided apparatus comprising an audio distribution unit (10) having means (11) for providing audio signals from audio sources and output ports (12A . . . 12D) for supplying sets of audio transducers, each said set comprising at least a first audio transducer (14A(L)) and a second audio transducer (14A(R)) and having associated therewith at least one remote unit (34A), the first and second audio transducers (14A(L),14A(R)) and the remote unit (34A) being connected to the audio distribution unit (10) by a set of four conductors, the apparatus further comprising means (22A . . . 22D,44,76,80-96) for supplying audio signals to the audio transducers (14A(L),14A(R)) and transferring at least one of power and data signals between said audio distribution unit (10) and said remote unit (34A), all by way of the four conductors.

In one embodiment of this first aspect, the audio distribution unit (10) comprises first and second power amplifiers (24A(L),24A(R)), a first conductor (26A(L1)) connects one terminal of each of said first and second audio transducers (14A(L), 14A(R)) and one terminal of the remote unit (34A) to a ground terminal of the audio distribution unit (10), a second (26A(L2)) of the conductors connects a drive-signal terminal of said first audio transducer (14A(L)) to a corresponding output terminal (30A(L)) of said first power amplifier (24A(L)), a third conductor (26A(R1)') connects a second terminal of the remote unit (34A) to an interface unit (44) of the audio distribution unit (10), and a fourth conductor (26A(R2)) connects a drive-signal terminal of said second audio transducer (14A(R)) to a corresponding output terminal (30A(R)) of said second power amplifier (24A(R)), the audio signals being supplied by way of the first, second and fourth conductors and the at least one of power and data signals being transferred by way of the first and third conductors.

In another embodiment of the first aspect, the audio distribution unit (10) comprises first and second power amplifiers (24A(L),24A(R)) each connected to a respective one of two grounds (1,2) that are separated electrically from each other, a first conductor (26A(L1)) connects one drive-signal terminal of the first audio transducer (14A(L)) to a ground terminal of the first power amplifier (24A(L)), a second conductor (26A(L2)) connects the other drive-signal terminal of the first audio transducer (14A(L)) to an output terminal (30A(L)) of the first power amplifier (24A(L)), a third conductor (26A(R1)) connects one terminal of the second audio transducer (14A(R)) to a ground terminal of the second power amplifier (24A(R)), and a fourth conductor (26A(R2)) connects the other drive-signal terminal of the second audio transducer (14A(R)) to a corresponding output terminal (30A(R)) of the second power amplifier (24A(R)), the audio signals being supplied to the first audio transducer (14A(L)) by way of the first and second conductors, and to the second audio transducer (14A(R)) by way of the third and fourth conductors, and said at least one of power and data signals being transferred by way of the first (26A(L1)) and third (26A(R1)) conductors.

According to a second aspect of the invention, there is provided apparatus comprising an audio distribution unit having input means for audio signals from audio sources and output ports connected to at least one set of audio transducers. The set of audio transducers comprises at least a first audio transducer and a second audio transducer connected to a respective set of said output ports by a set of conductors comprising first, second, third and fourth conductors. The apparatus further comprises at least one remote unit associated with the set of audio transducers. The audio distribution unit has a first ground and a separate second ground. The first conductor and the second conductor connect respective drive-signal terminals of the first audio transducer to the first ground and a line terminal of a first of the set of output ports, respectively, of the audio distribution unit. The third conductor and the fourth conductor connect respective drive signal terminals of the second audio transducer to the second ground and a line terminal of a second of the set of output ports, respectively, of the audio distribution unit. The remote unit is connected to the first ground and the second ground. The apparatus further comprises transferring means for transferring at least one of power and data signals between the audio distribution unit and the remote unit by way of a transmission path including the first ground and second ground.

Preferably, the or each remote unit is connected to the first ground and the second ground by the first conductor and third conductor, respectively.

The transferring means may comprise means for maintaining a potential difference between the first and second grounds, and the remote unit then may comprise a power extraction circuit connected to the first ground and second ground for extracting power for operation of components of the remote unit.

The apparatus may comprise a plurality of such sets of audio transducers connected by a corresponding plurality of sets of conductors and having a corresponding plurality of associated remote units. Each remote unit may then be connected to the first ground and second ground in the audio distribution unit by conductors of the same set of conductors that connect the associated audio transducers to the audio distribution unit. Alternatively, one or more of the remote units may be connected to the audio distribution unit by at least one of the conductors of a set connecting a different set of audio transducers to the audio distribution unit, i.e. not the set of audio transducers with which that remote unit is associated.

Where the apparatus comprises a plurality of audio transducer sets, the transferring means may include means at each remote unit for including an identifier in its transmitted data signals and means at the audio distribution unit for detecting the identifier and identifying therefrom the corresponding remote unit.

The or each remote unit may comprise modulator means for providing signals modulated in dependence upon data input thereto, and the audio distribution unit then may have a corresponding demodulator means connected between the grounded conductors for detecting and demodulating such modulated signals. The audio distribution unit then may comprise control means, such as a microcomputer, responsive to the demodulated signals for controlling operation of the audio distribution unit.

The audio distribution unit also may have modulation means for transmitting onto the transmission path signals modulated according to data signals received from components of, or attached to, the audio distribution unit. The remote unit then may have a corresponding demodulator for detecting and demodulating such signals received via the transmission path from the audio distribution unit.

The remote unit and audio distribution unit may employ any suitable bandpass data transmission scheme, such as Frequency Shift Keying or Amplitude Shift Keying, for communicating said signals.

Preferably, the audio distribution unit comprises a preamplifier unit and an audio power amplifier unit for supplying audio signals from the preamplifier unit to the set of audio transducers, the audio power amplifier unit comprising first and second power amplifiers coupled to the first and second audio transducers, respectively, and having their ground terminals coupled to the first and second grounds, respectively. The first power amplifier then has its input connected directly to a corresponding first audio output port of the preamplifier unit and the second power amplifier has its input coupled to the corresponding second audio output port of the preamplifier unit by way of a coupling device arranged to permit a potential difference between the ground terminals of the second power amplifier and the preamplifier unit, respectively.

In one preferred embodiment, the first power amplifier has a ground terminal and an output terminal connected by said first and second conductors, respectively, to said one of the two audio transducers, the ground terminal being connected to said first ground, and an input terminal connected to a first audio output port of the preamplifier unit. The second power amplifier has a ground terminal and an output terminal connected by said third and fourth conductors, respectively, to said other of the two audio transducers, and an input terminal connected to an output of the coupling device, the coupling device having its input connected to the second audio output port of the preamplifier unit, and the second power amplifier ground terminal being connected to said second ground.

The audio distribution unit may have a third ground separate from both the first ground and the second ground, the set of output ports comprise a third output port, the one set of audio transducers comprise a third audio transducer and the set of conductors further comprise a fifth conductor and a sixth conductor connecting drive terminals of the third audio transducer to ground and line terminals, respectively, of the third output port. The remote unit then may be connected also to the third ground, and the transferring means be connected to the reference, second and third grounds for transference of power to the remote unit via one pair of the three grounds and transference of the data signals via a different pair of the three grounds. Alternatively, signalling might be transferred via either or both of the channels.

The apparatus may comprise a second set of audio transducers connected to a corresponding second set of output ports of the audio distribution unit by a second set of first, second, third and fourth conductors and the audio distribution unit have a third ground separate from both the first ground and second ground, with a first audio transducer of the second set connected to the first ground and a second audio transducer of the second set connected to the third ground, a second remote unit being associated with the second set of audio transducers and connected to the audio distribution unit by a transmission path, conveniently different from the first transmission path. The transferring means then may be coupled to the third ground for transmission of either or both of power and signalling between the audio distribution unit and the second remote unit connected to the third ground and first ground.

Each remote unit may be connected to conductors connecting to the audio distribution unit the set of audio transducers with which it is co-located; or connected to conductors connecting a different set of audio transducers. In either case, signals to and from the remote unit will include an identifier identifying the location of the remote unit.

The apparatus may be provided with an intercom feature, whether the remote unit is connected to the audio distribution unit by a multiconductor cable or via the loudspeaker conductors. Thus, the remote unit may comprise voice circuitry for producing voice signals in response to a microphone and transmitting the voice signals to the audio distribution unit via the two grounds and means for adding to the signals at least one address of a remote unit, the audio distribution unit comprising means for detecting the voice signals and applying the detected voice signals to an input of the audio distribution unit, the audio distribution means comprising means for detecting the address and, in dependence thereon, directing the voice signals to one or more audio transducer sets other than that from which the voice signals originated.

According to a third aspect of the invention, there is provided apparatus comprising an audio distribution unit and a plurality of sets each of at least one audio transducer connected by a signal transmission path to the audio distribution unit, at least one of the sets of at least one audio transducer being remote from the audio distribution unit and having a remote unit associated therewith, the remote unit comprising voice circuitry for transmitting voice signals from a microphone via a transmission channel interconnecting the remote unit and the audio distribution unit, and means for adding to the signals at least one address corresponding to one of the sets of audio transducers, and the audio distribution unit comprises means for extracting the voice signals from the transmission channel and applying the extracted voice signals to an input of the audio distribution unit, and means for detecting the address and, in dependence thereon, directing the voice signals to one or more audio transducer sets other than that from which the voice signals originated.

The transmission channel may comprise conductors connected to the audio transducers, or separate conductors.

The audio distribution unit may have separate grounds, and the transmission channels be coupled between those grounds.

According to a fourth aspect of the invention, there is provided apparatus comprising an audio distribution unit having means for providing audio signals from at least one audio source controllable by infrared control signals, at least one audio transducer at a location remote from the audio distribution unit and connected thereto by a signal transmission path, and a remote unit associated with the audio transducer and connected thereto by a transmission channel, the apparatus further comprising an infrared transmitter for transmitting said infrared control signals for controlling said audio source, and wherein the remote unit comprises a receiver for receiving, from an infrared remote control device, infrared signals corresponding to said infrared control signals, generating in response thereto corresponding source control signals, and transmitting the source control signals to the audio distribution unit by way said transmission channel, the audio distribution unit having means for detecting said source control signals and controlling the infrared transmitter in dependence thereupon to generate said infrared control signals.

In embodiments of any of these aspects of the invention, the audio distribution unit and the audio transducers may be supplied separately. Hence, according to a fifth aspect of the invention, there is provided an audio distribution unit for use as part of the apparatus of the first aspect, and having means for providing audio signals from audio sources, a first ground, a separate second ground, at least one set of output ports each having a line terminal and a ground terminal, such set of output ports including a first output port and a second output port having their respective ground terminals connected to the first ground and second ground, respectively, for connection to a first and a second of a corresponding set of audio transducers, and means for transferring by way of said first ground and said second ground, and said first and second output ports, at least one of power and data signals between said audio distribution unit and a remote unit associated with said set of audio transducers.

According to a sixth aspect of the invention, there is provided an audio distribution unit for use as part of apparatus according to the second aspect, namely with a plurality of sets each of at least one audio transducer connected by a signal transmission path to the audio distribution unit, at least one of the sets of at least one audio transducer being remote from the audio distribution unit and having a remote unit associated therewith, the remote unit comprising voice circuitry (102) for transmitting voice signals from a microphone via a transmission channel interconnecting the remote unit and the audio distribution unit, and means for adding to the signals at least one address corresponding to one of the sets of audio transducers, said audio distribution unit comprising means for extracting the voice signals from the transmission channel, and means for detecting the address and, in dependence thereon, directing the voice signals to one or more audio transducer sets other than that from which the voice signals originated.

According to a seventh aspect of the invention, there is provided an audio distribution unit having means for providing audio signals from at least one audio source controllable by infrared control signals and configured for use with at least one audio transducer at a location remote from the audio distribution unit and connected thereto by a signal transmission path, and a remote unit associated with the audio transducer and connected thereto by a transmission channel, the remote unit comprising a receiver for receiving, from an infrared remote control device, infrared signals corresponding to said infrared control signals, generating in response thereto corresponding source control signals, and transmitting the source control signals to the audio distribution unit by way said transmission channel, the audio distribution unit having an infrared transmitter for transmitting said infrared control signals for controlling said audio source, and means for detecting said source control signals and controlling the infrared transmitter in dependence thereupon to generate said infrared control signals.

Various other objects, features, aspects and advantages of the present invention will become more apparent from the following detailed description, taken in conjunction with the accompanying drawings, of preferred embodiments of the invention, which are described by way of example only.

DESCRIPTION OF THE PREFERRED EMBODIMENT

Figure 1:
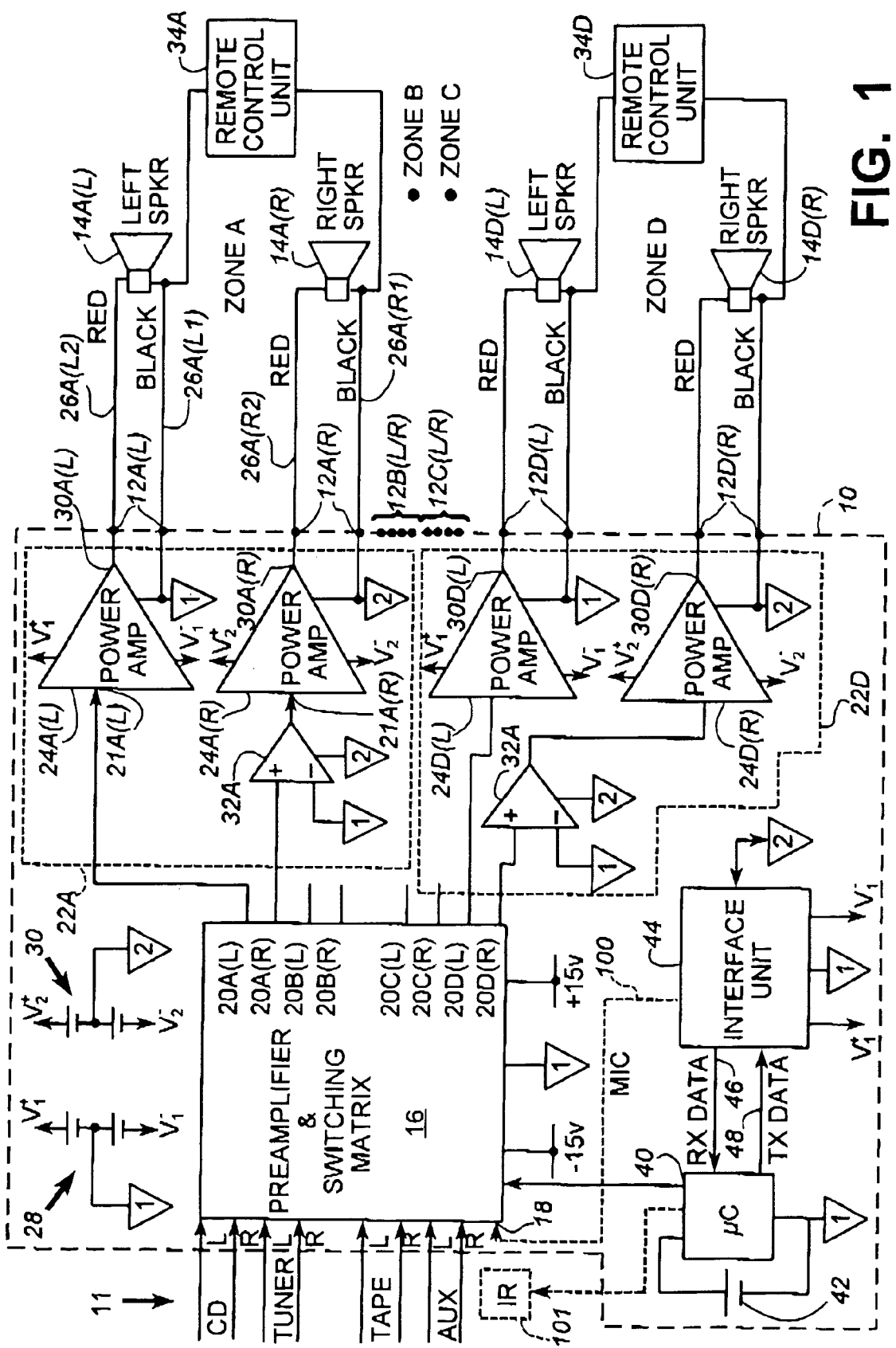
FIG. 1 is a schematic diagram of an audio system comprising an audio distribution unit and several sets of loudspeakers, each set located in a different zone and having an associated remote unit.

Referring to FIG. 1, a multi-zone audio system comprises an audio distribution unit 10 which has several stereo inputs. FIG. 1 shows inputs 11 for a compact disc player (CD), a radio tuner (TUNER) and a tape unit (TAPE), and an auxiliary input (AUX). Usually, there would be additional inputs for other sources, such as a video cassette recorder, digital video disc player (DVD) and so on. The audio distribution unit 10 has four sets of outport ports 12A, 12B, 12C and 12D connected to four sets of audio transducers, specifically loudspeakers, located in four zones A, 8, C and D, respectively. Each set of the output ports comprises a stereo pair of output ports 12A(L), 12A(R), . . . 12D(L), 12D(R). For clarity, only two sets of loudspeakers, namely loudspeakers 14A(R) and 14A(L) and 14D(R) and 14D(L) are shown. The letters (R) and (L) designate RIGHT and LEFT stereo channels, respectively, and the letters A and D designate the zones in which the sets of loudspeakers are located. Although FIG. 1 shows only two loudspeakers in each set, it could comprise more than two loudspeakers, such as might be used in a "surround sound" or home theater system.

The audio distribution unit 10 comprises a preamplifier unit 16 which includes the usual preamplifier and a switching matrix allowing some or all of the inputs 11 to be connected simultaneously to respective sets of the loudspeakers. The preamplifier unit 16 also has a data input port 18 for receiving data signals to control operation of the audio distribution unit 10, to vary, for example, volume, bass, treble and balance, and to operate the switching matrix to make or alter input/source selections. The construction of such a preamplifier unit 16 is known to persons skilled in this art, so it will not be described in detail here.

The audio distribution unit 10 also comprises four identical stereo power amplifier units (22A . . . 22D), one for each set of loudspeakers, connected to the four sets of stereo output ports 12A, 12B, 12C and 12D, respectively.

The loudspeakers 14A(L) and 14A(R) have the usual "RED" and "BLACK" drive signal input terminals, indicating the polarity of the windings so that the pair of loudspeakers can be connected to the associated power amplifiers with the same polarity, thereby ensuring proper stereo reproduction. For convenience of illustration, only two of the stereo power amplifier units, 22A and 22D, are shown, and only one unit, 22A, will be described. Stereo power amplifier unit 22A comprises two identical audio power amplifiers 24A(L) and 24A(R), connected to loudspeakers 14A(L) and 14A(R), respectively, by a set of loudspeaker cables comprising first and second conductors 26A(L1) and 26A(L2) connecting the BLACK and RED terminals of LEFT loudspeaker 14A(L) to the ground terminal and line terminal 30A(L), respectively, of amplifier 24A(L) via output port 12A(L) and third and fourth conductors 26A(R1) and 26A(R2) connecting BLACK and RED terminals of the RIGHT loudspeaker 14A(R) to the ground terminal and line output terminal 30A(R) respectively, of amplifier 24A(R) via output port 12A(R). LEFT stereo channel power amplifier 24A(L) has its input connected to LEFT channel line output terminal 20A(L) of preamplifier unit 16, and its power supply terminals connected to a first power supply 28 which supplies voltages $V_1^+$ and $V_1^-$, with amplitude of, say, +35 volts and −35 volts, respectively, relative to a first, reference ground designated as ground "1". The GROUND terminal of LEFT power amplifier 24A(L) is connected to first ground "1". The preamplifier unit 16 is shown grounded to ground 1 and supplied with power at ±15 volts, conveniently derived from power supply 28 by means of a suitable regulator circuit (not shown).

The RIGHT channel power amplifier 24A(R) is powered by supply voltages $V_2^+$ and $V_2^-$, also, say, +35 volts and −35 volts, respectively, derived from a second power supply 30, which supplies voltages $V_2^+$ and $V_2^-$ relative to a second ground designated as ground "2". The GROUND terminal of power amplifier 24A(R) is connected to second ground "2". Hence, the BLACK terminals of loudspeaker 14A(L) and 14A(R) are connected to first ground 1 and second ground 2, respectively.

The signal input 21A(L) of power amplifier 24A(L) is connected directly to the LEFT channel output terminal 20A(L) of the preamplifier unit 16. The signal input 21A(R) of power amplifier 24A(R), however, is connected to the corresponding RIGHT channel output terminal 20A(R) of preamplifier unit 16 by way of a coupling device, specifically, a differential amplifier 32A which has its output terminal connected to the input 21A(R) of RIGHT channel power amplifier 24A(R), its non-inverting input terminal (+) connected to the RIGHT channel output terminal 20A(R) of the preamplifier unit 16, and its inverting input terminal (−) connected to first ground 1. The GROUND terminal of differential amplifier 32A is connected to second ground 2.

The differential amplifier 32A will maintain the difference between its output and ground 2 so that it is the same as the difference between its non-inverting and inverting inputs. The signal applied to the input 21A(R) of power amplifier 24A(R), relative to first ground 1, will be the sum of the RIGHT channel audio signal from preamplifier terminal 20A(R) and any voltage difference between first ground 1 and second ground 2. Because the output 30A(R) of power amplifier 24A(R) is referenced to second ground 2, however, only the audio signal will appear on the RED and BLACK loudspeaker conductors 26A(R1) and 26A(R2), as a differential mode signal. Any variations in the voltage between first ground 1 and second ground 2, however, will appear on both conductors 26A(R1) and 26A(R2), i.e. as common mode signals, and hence will not be "seen" by loudspeaker 14A(R). Accordingly, grounds 1 and 2 and the two loudspeaker ground (BLACK) conductors 26A(L1) and 26A(R1) may be used as a transmission path or channel for "common mode" transmission of power and signalling, as will be described later.

It should be appreciated that the connections between the loudspeaker cable conductors and the RED and BLACK terminals could be transposed, i.e. the RED terminals of the loudspeakers 14A(L) and 14A(R) could be connected to the grounds 1 and 2, instead of the BLACK terminals, A remote control unit 34A for controlling the loudspeakers in zone A is connected across the conductors 26A(L1) and 26A(R1) and hence between the respective BLACK terminals of the loudspeakers 14A(R) and 14A(L).

Power amplifier unit 22D is identical to power amplifier unit 22A and so will not be described in detail. In FIG. 1, its components have the same reference numbers as the corresponding components in power amplifier 24A, but with the zone suffix "D".

The system includes means for transferring power and signalling between the audio distribution unit 10 and the remote unit 34A via the above-mentioned transmission path.

At the audio distribution unit 10, the transferring means includes a microcontroller 40, with its own 5 volt power supply 42 referenced to first ground 1, and a line interface unit 44 supplied by power supply 28 and referenced to first ground 1. The line interface unit 44 is connected to the microcontroller 40 by a first link 46 for data signals (RX) received from the remote control units 34A to 34D and a second link 48 for data signals (TX) from the microcontroller 40 which are to be transmitted to the remote control units 34A to 34D. The output of line interface unit 44 is connected to second ground 2 of power supply 30 and maintains second ground 2 at a potential difference of about 20 volts d.c. relative to ground 1. It should be noted, therefore, that second ground 2 and voltages $V_2^+$ and $V_2^-$ "float" relative to ground 1 and voltages $V_1^+$ and $V_1^-$ with a potential difference of about 20 volts d.c., subject to variations due to modulation signals, as will be described later.

In operation, the line interface unit 44 maintains this potential difference of about 20 volts d.c. between the first and third conductors 26A(L1) and 26A(R1) and likewise between the corresponding "grounded" conductors of the other loudspeaker sets in zones B, C and D. Because the remote control units are connected between these "grounded" conductors, they are able to extract power at 20 volts d.c. from the interface unit 44. At each of the remote control units 34A to 34D, the afore-mentioned transferring means includes means for transmitting signals to the microcontroller 40 via the signal transmission channel defined by the pair of "grounded" conductors to which it is connected, specifically by applying modulated signals to them. Also, the line interface unit 44 can transmit modulated signals to the remote units via the transmission channels.

Figure 2:
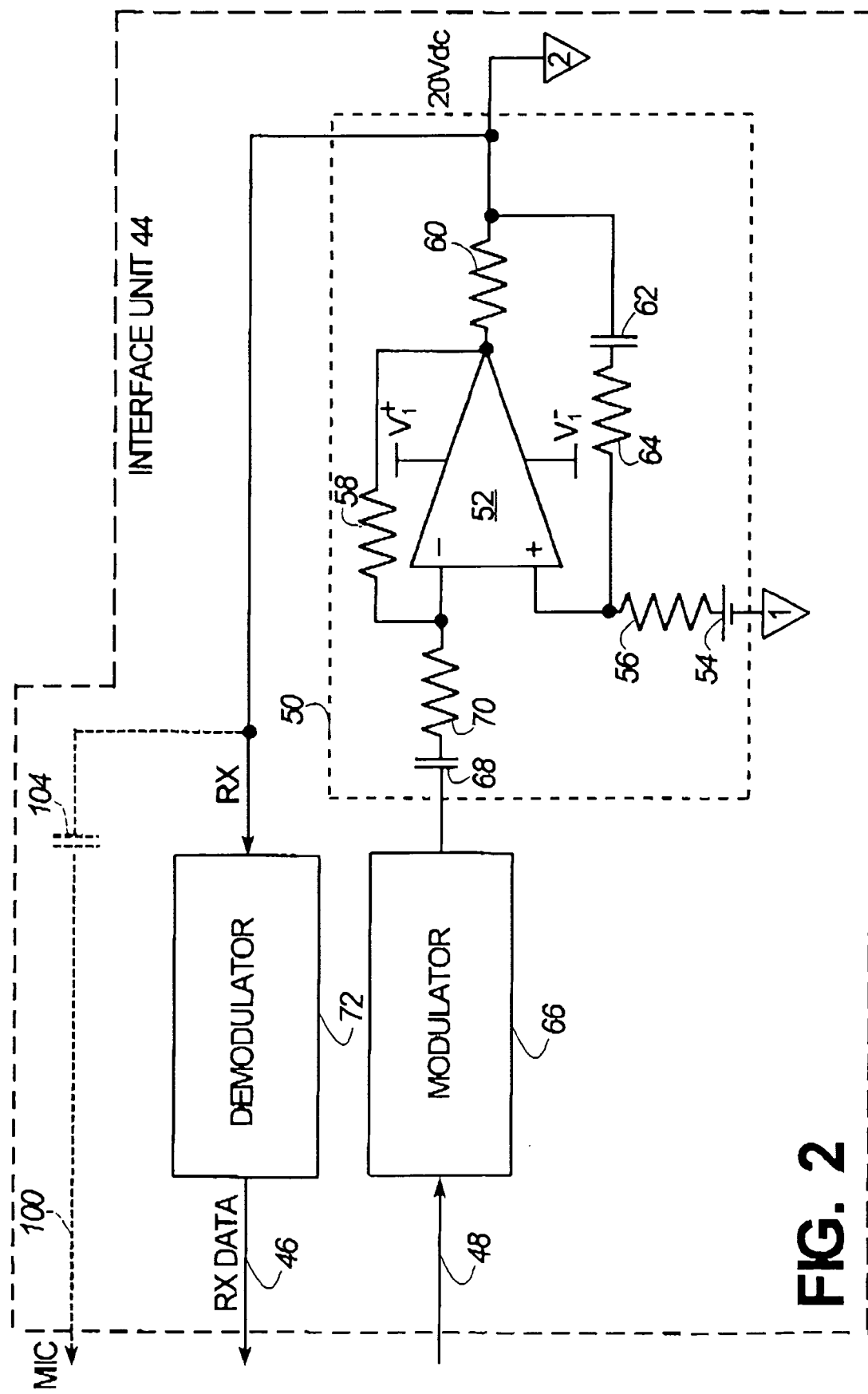
FIG. 2 is a more detailed block schematic diagram of a line interface unit of the audio distribution unit.

Referring to FIG. 2, a suitable line interface unit 44 comprises a transconductance amplifier and D.C. voltage source unit 50 formed by an amplifier 52 which is supplied with voltages $V_1^+$ and $V_1^-$ from power supply 28 (FIG. 1) and has a non-inverting input (+) coupled to a 20 volt d.c. source 54 by a resistor 56. The source 54 has its negative terminal connected to first ground 1. The inverting input (−) of amplifier 52 is connected to its output by a first feedback loop comprising a resistor 58. An output resistor 60 connects the output of the amplifier 52 to ground 2. A second feedback loop is formed by a capacitor 62 and a resistor 64 connected in series between the second ground 2 and the non-inverting input (+) of amplifier 52. In operation, and when quiescent unit 50 maintains a potential difference of about 20 volts d.c. between grounds 1 and 2.

An output terminal of a modulator 66 is connected to the inverting input (−) of amplifier 52 by a second capacitor 68 and resistor 70, in series. The input of the modulator 66 is connected to the link 48 to receive digital data signals (TX) from the microcontroller 40 (FIG. 1). The modulator 66 may use Frequency Shift Keying (FSK), Amplitude Shift Keying (ASK), or any other type of modulation suitable for digital data transmission. When half duplex FSK is used, suitable mark and space carrier frequencies might be 100 kHz for "1" and 90 kHz for a zero. Full duplex FSK could be implemented using two additional frequencies.

A demodulator 72 has its input connected to the output of the transconductance amplifier unit 50 (and hence to second ground 2), and its output connected to the link 46 to pass demodulated digital data signals (RX) received on second ground 2 to the microcontroller 40 (FIG. 1).

In use, signals received on link 48 from the microcontroller 40, for example to give the status of the controls of audio distribution unit 10, are modulated by modulator 66 and supplied to amplifier 52, which transmits them onto the second ground 2 and hence broadcasts them to all of the remote control units 34A-34D. Each remote control unit has a unique address assigned during a set-up procedure and mapped to the corresponding zone by suitable entries in the memory of the microcontroller 40. The microcontroller 40 will include in each broadcast signal the address of the remote control unit 34A-34D for which the signal is intended. The remote control unit for which the signal is intended will detect its own address in the signal, process the signal accordingly, using known techniques, and provide a suitable response, such as displaying a setting for one of the parameters of the audio distribution unit 10. Conversely, signals applied to one of the transmission channels by one of the remote control units 34A-34D, when received in the interface unit 44, will be demodulated by demodulator 72 and transmitted via link 46 to the microcontroller 40. All of the remote control units 34A-34D are effectively connected in parallel between first grounds 1 and second ground 2, and all transmitters in both the interface unit 44 and, as will be described later, the remote control units, have low output impedances, of the order of 100 ohms. Consequently, as soon as one of them transmits a signal, all of the others will receive it. Each of the remote control units 34A-34D is arranged to inhibit operation of its own transmitter while its own receiver is receiving a signal, as is common in transceivers. This same feature will operate to inhibit the transmitters of all other remote control units as soon as one of them begins to transmit, thereby avoiding "collisions" if two users using different ones of the remote control units 34A-34D attempt to control the audio distribution unit 10 at the same time.

Figure 3:
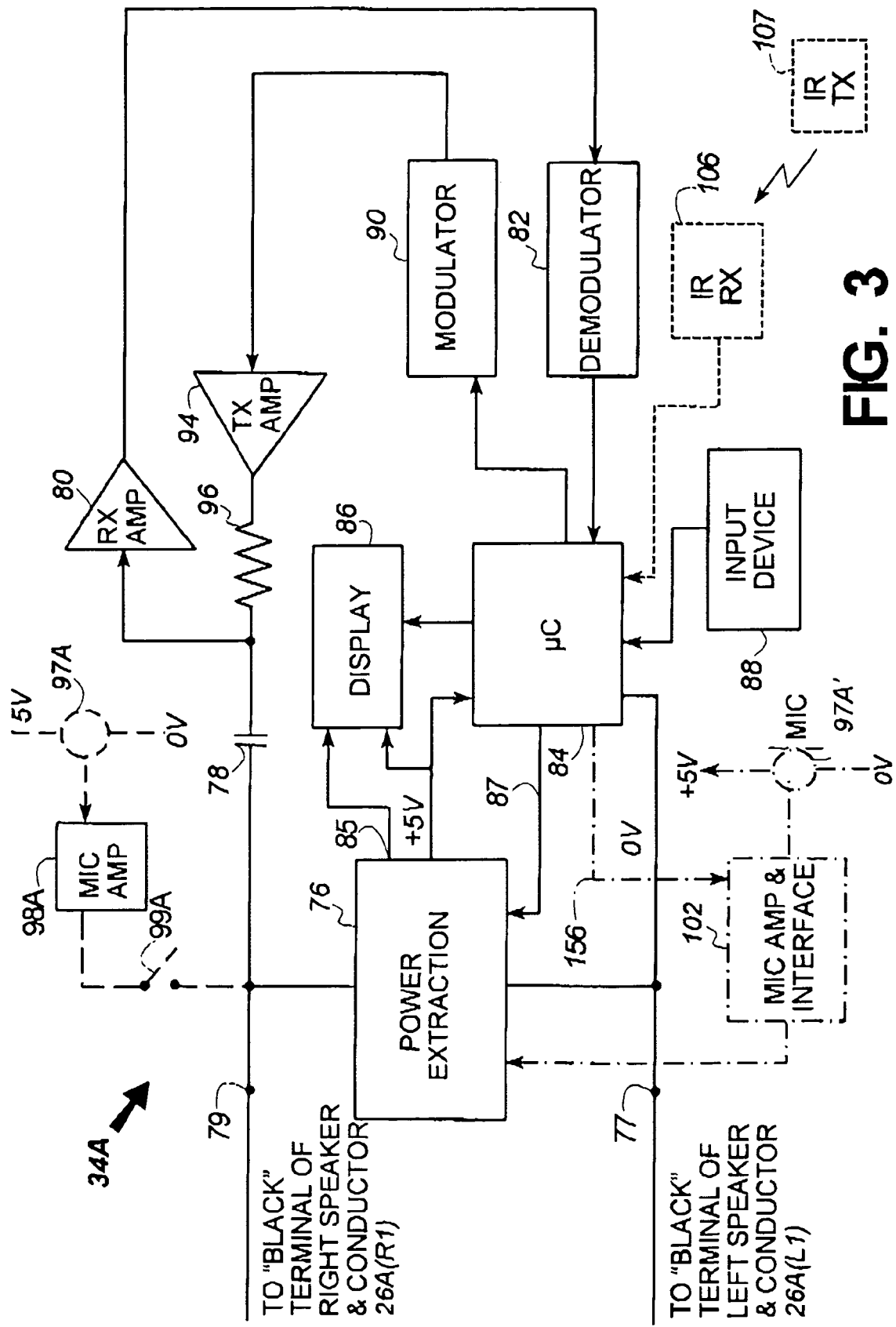
FIG. 3 is a more detailed block schematic diagram of the remote unit.

The remote control units 34A-34D are identical, so only one will be described. As shown in FIG. 3, a suitable remote control unit 34A comprises a power extraction circuit 76 connected across terminals 77 and 79 which, in use, are connected to the BLACK terminals of the LEFT and RIGHT loudspeakers, respectively, and hence across "grounded" first and third conductors 26A(L1) and 26A(R1), respectively. The power extraction circuit 76 supplies the various components of the remote control unit 34A, including a second microcontroller 84, at a voltage of 5 volts d.c., and has a "backlight" output 85 which supplies the backlight of a display 86. (For clarity, the supply connections to second microcontroller 84 and display 86 only are shown). The backlight supply is turned on and off by the microcontroller 84 by way of a control signal line 87 connecting a backlight on/off output of the microcontroller 84 to the power extraction circuit 76. The connection of terminal 77 to the BLACK terminal of the left loudspeaker 14A(L), i.e. to first conductor 26A(L1) and indirectly to ground 1, constitutes the ground for the remote control unit 34A.

The third conductor 26A(R1) (BLACK terminal) of the RIGHT loudspeaker 14A(R) is connected via an isolating capacitor 78 to an input of a receiver amplifier 80, the output of which is connected to the input of a demodulator 82, which operates conversely to the modulator 66 in the interface unit 44 to demodulate received signals. The output of the demodulator 82 is coupled to an input of the second microcontroller 84 which controls display 86. An input device 88, for example a keypad having a set of pushbuttons, or a touch-screen overlay on display 86, is coupled to a second input of the microcontroller 84 for manual inputting of instructions or data by a user.

An output of microcontroller 84 is connected to an input of a modulator 90 which corresponds to the demodulator 72 in interface unit 44. The output of the modulator 90 is connected to an input of a transmitter amplifier 94, the output of which is coupled to the third conductor 26A(R1), and hence the second ground 2, by way of a (100%) termination resistor 96 which connects the output of the transmitter amplifier 94 to the isolating capacitor 78.

The power extraction circuit 76, microcontroller 84, modulator 90, demodulator 82, and amplifiers 80 and 94 constitute parts of the afore-mentioned transferring means, the other parts being in the audio distribution unit 10.

Figure 4:
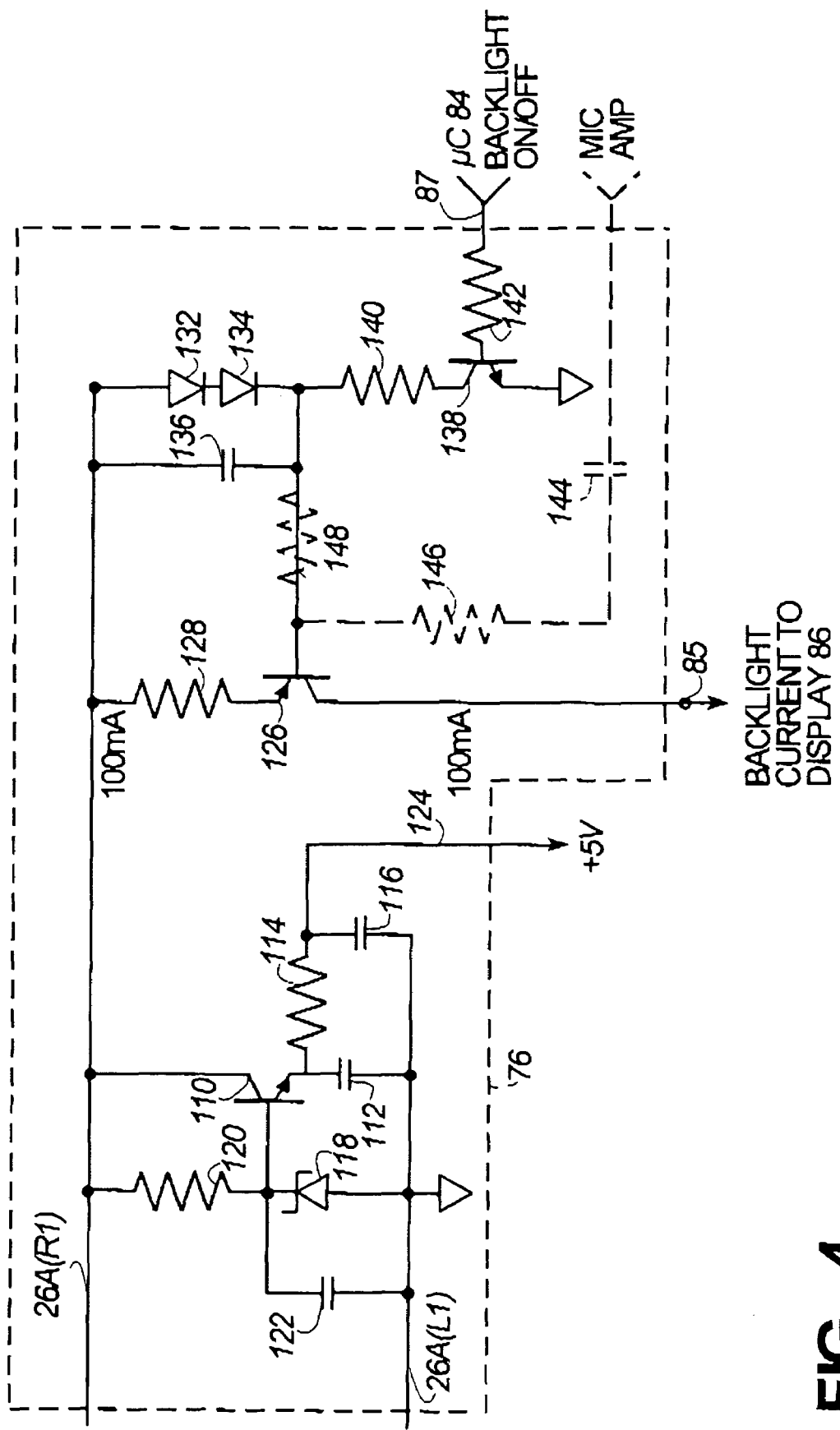
FIG. 4 is a schematic circuit diagram of a power extraction circuit of the remote unit.

The power extraction circuit 76, shown in detail in FIG. 4, comprises a first transistor 110 with its collector connected to third conductor 26A(R1) and its emitter coupled to first conductor 26A(L1) by way of a capacitor 112. A resistor 114 and capacitor 116 are connected in series between the transistor emitter and first conductor 26A(L1). The capacitors 112 and 116 and resistor 114 form a filter to remove digital noise. A 5.6 volt Zener diode 118 and feed resistor 120 are connected in series between the conductors 26A(R1) and 26A(L1). The cathode of the Zener diode 118 is connected to the base of transistor 110 and, by way of a smoothing capacitor 122, to the local ground, i.e. conductor 26A(L1). The transistor 110 acts as a voltage follower with a voltage drop equivalent to that of one diode, and the 5 volt supply for the various components of the remote control unit is taken from the junction between resistor 114 and capacitor 116, on line 124.

The backlight supply circuitry comprises a second transistor 126 connected as a constant current source, with its emitter connected by way of a resistor 128 to conductor 26A(R1) and its collector connected to the backlight output 85 and hence to display 86 (FIG. 3). Transistor 126 is biased by means of a pair of diodes 132 and 134 connected in series between conductor 26A(R1) and the base of transistor 126. A second smoothing capacitor 136 is connected in parallel with the diodes 132 and 134 to smooth switching transients.

The backlight supply transistor 126 is turned on and off by means of a switching transistor 138 which has its emitter grounded (to the local ground-conductor 26A(L1)), its collector coupled by way of a resistor 140 to the cathode of diode 134 and its base coupled by way of a resistor 142 and control line 87 to the backlight on/off output of the microcontroller 84 (FIG. 3). The microcontroller 84 is programmed so that, as soon as the user operates the input device 88 (FIG. 3), for example presses a key, it turns on transistor 138 which turns on the backlight current.

The microcontroller 84 stores the address for the remote unit in the system. When a user presses a key, the microcontroller 84 extracts the address of its own remote unit and includes it in a data signal, which then is transmitted to the microcontroller 40 in the audio distribution unit 10, allowing the latter to determine the source of the data signal. The microcontroller 40 will control the audio distribution unit 10 according to the content of the data signals received from the remote unit 34A and will communicate to the transmitting remote unit 34A such data signals as are appropriate.

Referring again to FIG. 3, when the system is in use, signals received from the interface unit 44 via conductors 26A(R1) and 26A(L1) are amplified by receiver amplifier 80, which also provides bandpass filtering to limit the signal to the transmit bandwidth of the modulator 66 (FIG. 2), demodulated by demodulator 82 and supplied to the microcontroller 84, which deciphers the signals and controls the display 86 accordingly. Conversely, when a user inputs information or commands by way of input device 88, corresponding digital data signals from the microcontroller 84 are modulated by modulator 90, amplified by transmitter amplifier 94 and applied to the conductor 26A(R1).

As mentioned previously, each of the remote control units 34A-34D has the ability to turn off its own transmitter when its receiver is receiving a data signal. Thus, the microcontroller 84 continuously monitors the output of the demodulator 82 and compares it with the input to the modulator 90. If they are not the same, a "collision" is assumed. If the microcontroller 84 is not driving the modulator 90 and transmitter amplifier 94, and the demodulator 82 is outputting a data signal (the demodulator output has a data valid line and a data line), the microcontroller 84 inhibits its own transmissions. In a similar manner, in the audio distribution unit 10 (FIG. 1), the microcontroller 40 will monitor RX data line 46 and inhibit its own transmissions as required. In essence, the arrangement is like a network, with the audio distribution unit 10 acting as a hub to which the remote control units 34A-34D are connected by their respective transmission channels formed by pairs of loudspeaker conductors. When any network element is transmitting, the other elements wait until the transmission ends before seizing the opportunity to transmit themselves. The network analogy also applies to the use of unique addresses for the remote units, enabling selective communications using known network signalling techniques.

Various modifications and substitutions may be made to the above-described embodiment without departing from the scope of the present invention. Thus, it is envisaged that a full wave rectifier could be interposed between the conductors 26A(R1) and 26A(L1) and the power extraction circuit 76 of each of the remote control units 34A-34D, so that the power supply to the remote control units would be independent of the polarity of the potential difference on the corresponding transmission channel. This would, of course, require the use of a polarity-insensitive signalling scheme, such as FSK or ASK.

It is also envisaged that the system could be modified to add an intercom feature, in which case the signals transmitted between the audio distribution unit 10 and the remote unit(s) 34A-34D would include baseband voice signals as well as the data signals, the latter being above baseband.

FIGS. 2 and 3 illustrate, in dashed lines, a modification to the interface unit 44 two alternative modifications to the remote unit 34A, which would permit intercom use, it being understood that similar modifications would be made to the other remote units 34B-34D. As shown in dashed lines in FIG. 3, remote control unit 34A could have a microphone 96A connected by way of a microphone amplifier 98A and intercom ON/OFF switch 99A (conveniently controlled by microcontroller 84) directly to the conductor 26A(R1) allowing transmission of voice signals via the conductors 26A(L1) and 26A(R1) to the interface unit 44. As shown in broken lines in FIG. 2, the interface unit 44 could then have a capacitor 104 or other suitable voice circuitry for extracting the voice signal and supplying it to an extra input (not shown), such as the microphone input MIC, of preamplifier unit 16, by way of a suitable connection 100 shown in broken lines in FIG. 1.

Alternatively, and preferably, the voice signal could be transmitted by modulating the "backlight" current of the power extraction unit 76. Suitable additional circuitry for doing so is shown in chain-link lines in FIGS. 3 and 4. Thus, referring to FIG. 3, microphone 96A' is connected to microphone amplifier and interface circuit 102, the output of which is connected to an input of the power extraction circuit 76. As shown in FIG. 4, within the power extraction circuit 76, the output of the microphone amplifier and interface unit 102 (FIG. 3) is coupled to the base of transistor 126 by way of an additional capacitor 144 and an additional resistor 146 connected in series. An additional resistor 148 is inserted in series with the base of transistor 126. Resistors 146 and 148 are equal in value, suitably 100 ohms, so about one half of the voice signal is applied to the base of the transistor 126. The voice signal modulates the backlight current on the collector of transistor 126, which typically has a quiescent value of about 100 mA. The backlight supply circuitry of power extraction circuit 76 is a constant current source. Consequently, variations in the backlight current will appear as changes in the voltage across first ground 1 and second ground 2 in the audio distribution unit 10. When the user speaks, the backlight current will vary in proportion to the output of microphone amplifier and interface unit 102.

It is also envisaged that the voice signal could be used to modulate the total current consumed by the remote unit.

The system may be capable of paging, in which case the message is broadcast to all of the other zones, or directed messaging, in which case the message is sent to one or more zones selected by the user. A user wishing to send, for example, broadcast voice signals, will press a corresponding key or symbol on the input device 88. The microcontroller 84 will respond by turning on the backlight (if it is not already on), detecting the "intercom" selection, generating a corresponding data signal including the address of the local remote unit 34A and transmitting it to microcontroller 40 in the audio distribution unit 10, at the same time operating switch 99A to enable voice transmissions. On receipt of the "intercom" data signal on line 46, the microcontroller 40, which is suitably programmed, will detect the address of remote unit 34A only and issue a control signal to the preamplifier unit 16 to cause the switching matrix to route the voice signals from the MIC input 18 to the loudspeaker sets in all of the other zones B, C and D, muting or reducing their existing signals as appropriate. When, subsequently, the user speaks into the microphone 96A, the voice signal will be broadcast to the loudspeakers in the other zones B, C and D. It will be appreciated that, to avoid feedback problems, the voice signal will not be transmitted to the audio transducer set in the zone from which the voice signal originated.

If the user wished to direct the message to a particular zone, he would first select the "intercom" mode and then identify the reception zone using the input device 88. The microcontroller 84, which would have all of the zone addresses stored in memory, would select the appropriate address and include it in the message, as a "recipient" address, together with the "sender" zone address. At the audio distribution unit 10, the microcontroller 40 would detect the recipient zone address and control the switching matrix so as to direct the message to the one zone only.

It will be appreciated that this intercom system could also be modified to allow the user to input several recipient addresses and send the same voice message to several selected zones, but not broadcast to all of them.

Figure 5:
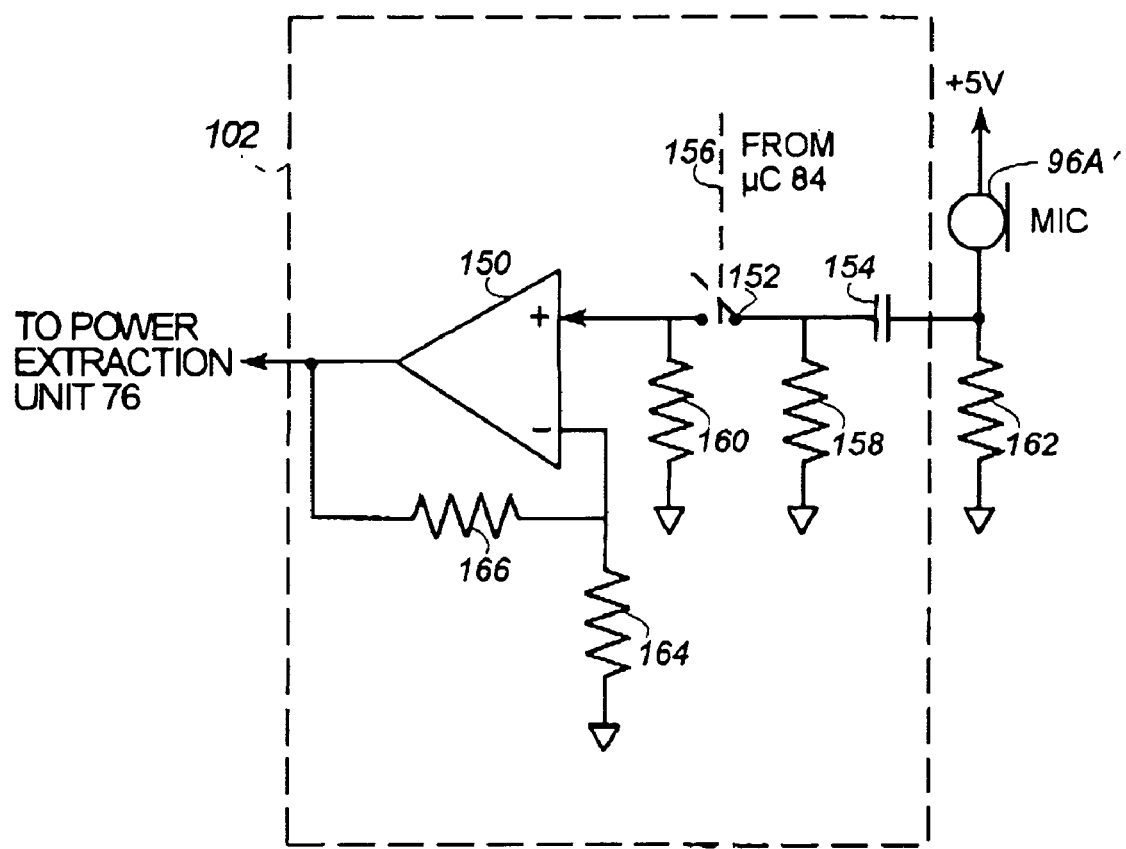
FIG. 5 is a schematic circuit diagram of a microphone and a microphone interface of a first modification.

As shown in FIG. 5, a suitable microphone amplifier and interface unit 102 comprises an amplifier 150 having its non-inverting input connected to the microphone 96A' by way of an ON/OFF switch 152 and a blocking capacitor 154 in series. The switch 152 may be a CMOS analog switching device or other suitable device controlled by the microcontroller 84 by way of line 156. The poles of the switch 152 are connected to local ground by resistors 158 and 160, respectively. As depicted in FIG. 5, the microphone 96A' is an electret microphone comprising an internal field effect transistor (not shown) connected between the 5 volt supply and, by way of a bias resistor 162, local ground. The inverting input of amplifier 150 is connected to local ground by way of a resistor 164 and, by way of a feedback resistor 166, to the output of amplifier 150, which output is connected to the capacitor 144 in power extraction unit 76 (FIG. 4).

In use, the user will select the intercom function by means of the input device 88. The microcontroller 84 will respond by turning on the backlight current (if it is not already on), closing normally-open switch 152, and, as before, transmitting data signals to select the loudspeaker sets to receive the voice signals. When the user speaks into the microphone 96A', the amplified voice signal will modulate the current flowing through constant current source transistor 126 (FIG. 4). At voice frequencies, the constant current flows through a substantially constant impedance, i.e. the output impedance of interface unit 44. As a result the potential difference across the conductors 26A(R1) and 26A(L1) will be modulated with the voice signal.

As before, at the interface unit 44, a capacitor 104 connected between the input of the demodulator 72 and the line 100 will extract the voice signal and supply it to the appropriate input 18 of the preamplifier unit 16.

It is envisaged that the intercom arrangement could be used with a multiconductor system, the transmission channel via which the voice signals are transmitted being defined by conductors other than those used to transmit the audio signals to the audio transducers.

Where a zone is equipped with a set of more than two loudspeakers, with a correspondingly greater number of "ground" wires, any two of the ground wires could be selected to form the transmission channel, providing that they were connected to the separate first ground 1 and second ground 2, so that the signalling was common mode with respect to the power amplifiers and loudspeakers and did not interfere with the audio signals.

For example, if there were four loudspeakers in a particular zone, two with their respective "ground" conductors connected to first ground 1 and two with their respectively "ground" conductor connected to second ground 2, the remote unit could be connected between either one of the first ground 1 conductors and either one of the second ground 2 conductors.

Figure 7:
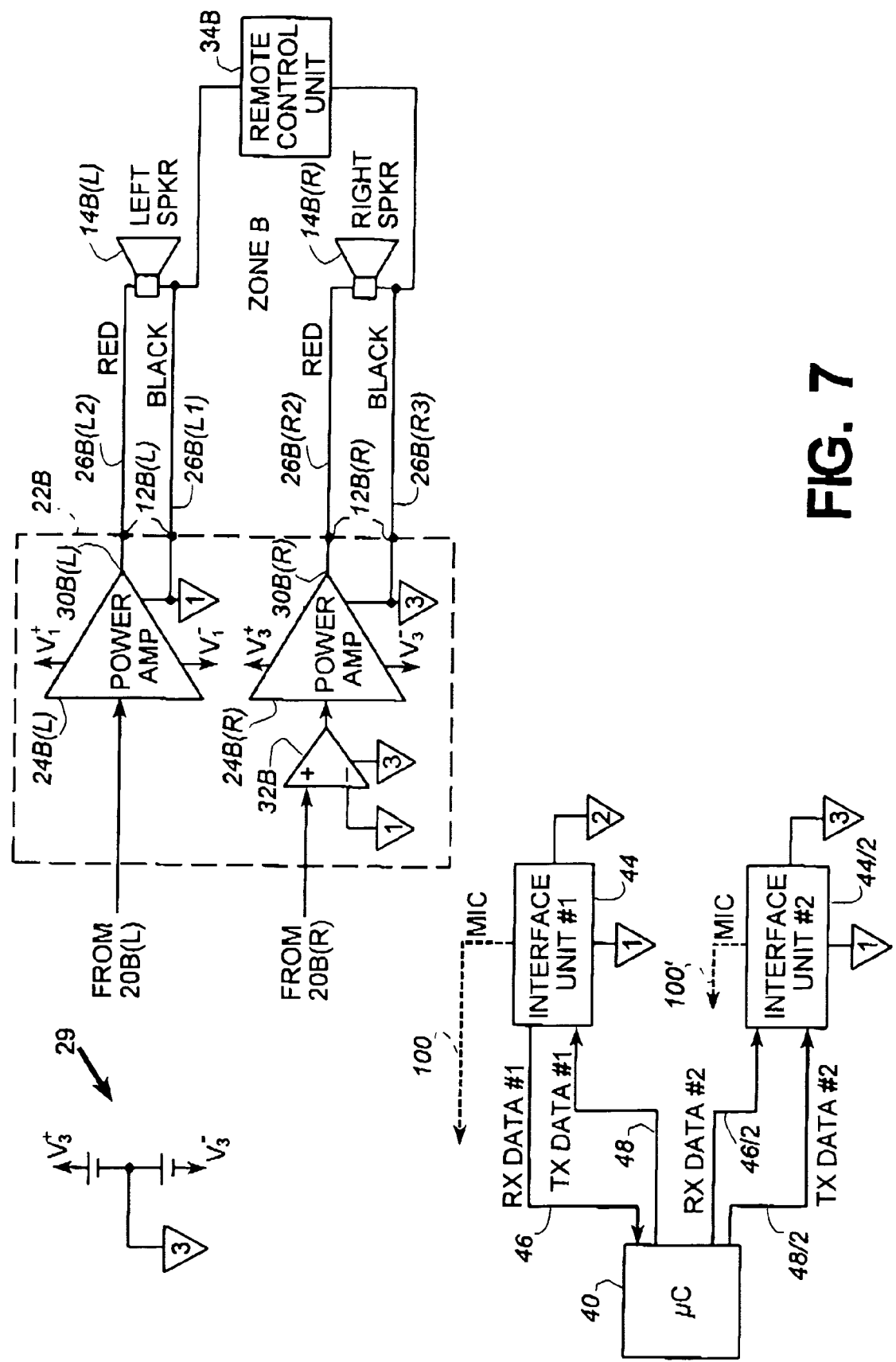
FIG. 7 illustrates modifications to parts of the audio system of FIG. 1 to provide different grounds for different sets of loudspeakers.

It is also envisaged that the audio distribution unit 10 could have at least a third ground 3, isolated from both first ground 1 and second ground 2, and the "ground" conductors of one or more of the audio transducer sets could be connected between the first ground 1 and the third ground 3, thereby forming a separate transmission channel and providing better segregation between signals from the different remote units. Modifications to do so are illustrated in FIG. 7 which shows a modified power amplifier unit 22B and the loudspeakers of zone B, together with an additional interface unit 44/2 and additional power supply 29 in the audio distribution unit 10. Other components of the system, i.e. for zones A, C and D, will be as shown in FIG. 1.

As shown in FIG. 7, the third power supply 29 provides voltages $V_3^+$ and $V_3^-$, say +35 volts and -35 volts, relative to third ground 3, conveniently, but not necessarily, the same as that between first ground 1 and second ground 2. The second interface unit 44/2, which is similar in construction to first interface unit 44, is connected between the microcontroller 40 and third ground 3, and maintains third ground 3 at a predetermined voltage relative to first ground 1. It also may have a capacitor (not shown) for coupling voice signals via line 100' to a microphone input, or other suitable audio input, of the preamplifier unit 16 if the intercom feature is provided. Data links 46/2 and 48/2 couple received and transmitted data signals (RX2, TX2), respectively, between the microcontroller 40 and the third ground 3. The power amplifier unit 22B for zone B is generally similar to the power amplifier unit 22A of FIG. 1 and is connected to zone B loudspeakers 14B(L) and 14B(R) in a similar manner. It differs, however, in that the "ground" terminals of differential amplifier 32B and power amplifier 24B(R), and hence the "grounded" loudspeaker conductor 26B(R1), i.e. connected to the BLACK terminal of loudspeaker 14B(R), are connected to the third ground 3. Consequently, the transmission channel for zone B is defined by conductors 26B(L1) and 26B(R3) which connect the zone B remote unit 34B to first ground 1 and third ground 3, respectively.

As before, the differential amplifier 32B ensures that the audio signal from preamplifier output 20B(R) appears as a differential signal across the conductors 26B(R1) and 26B(R2) while variations in the potential difference between ground 1 and ground 3 appear on both of these conductors, i.e. in common mode, and so are not "seen" by the loudspeaker 14B(R).

Figure 8:
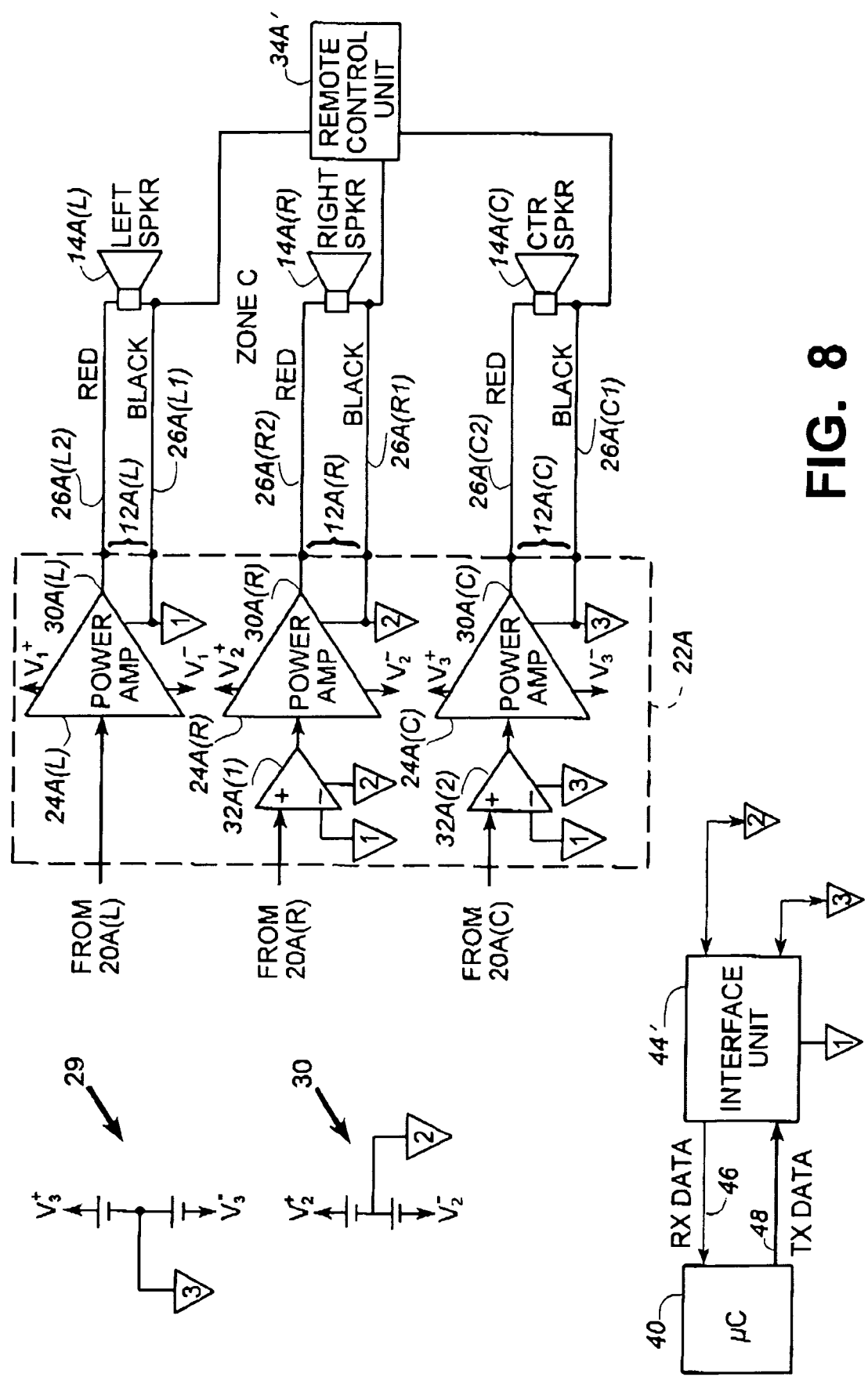
FIG. 8 illustrates a modification which uses three grounds to provide two transmission channels to a set of three loudspeakers, one channel for transmitting power and the other for signalling.

FIG. 8 illustrates how, when the set of audio transducers in a zone includes a third audio transducer, it would be possible to provide a third ground in the audio distribution unit 10 and connect the "ground" conductor of the third audio transducer to the third ground.

Thus, FIG. 8 shows a modified power amplifier unit 22A' connected to three loudspeakers 14A(L), 14A(R) and 14A(C) in zone A. The power amplifier unit 22A' comprises three power amplifiers 24A(L), 24A(R) and 24A(C) connected to the LEFT, RIGHT and CENTRE channel loudspeakers 14A(L), 14A(R) and 14A(C), respectively, by a set of six conductors 26A(L1) and 26A(L2), 26A(R1) and 26A(R2), and 26A(C1) and 26A(C2) connected to output ports 12A(L), 12(R) and 12(C). The ground terminals of power amplifiers 24A(L), 24A(R) and 24A(C) are connected to grounds 1, 2 and 3, respectively. The power amplifiers 24A(R) and 24A(C) are connected by differential amplifiers 32A(1) and 32A(2), respectively, to the corresponding outputs of preamplifier unit 16 and are supplied from power supplies 30 and 29, respectively. The audio distribution unit 10 has a modified interface unit 44' which has two outputs, one connected to ground 2 and the other connected to ground 3. A suitably modified remote unit 34A' is connected to all three ground conductors 26A(L1), 26A(R1) and 26A(C1)

Figure 9:
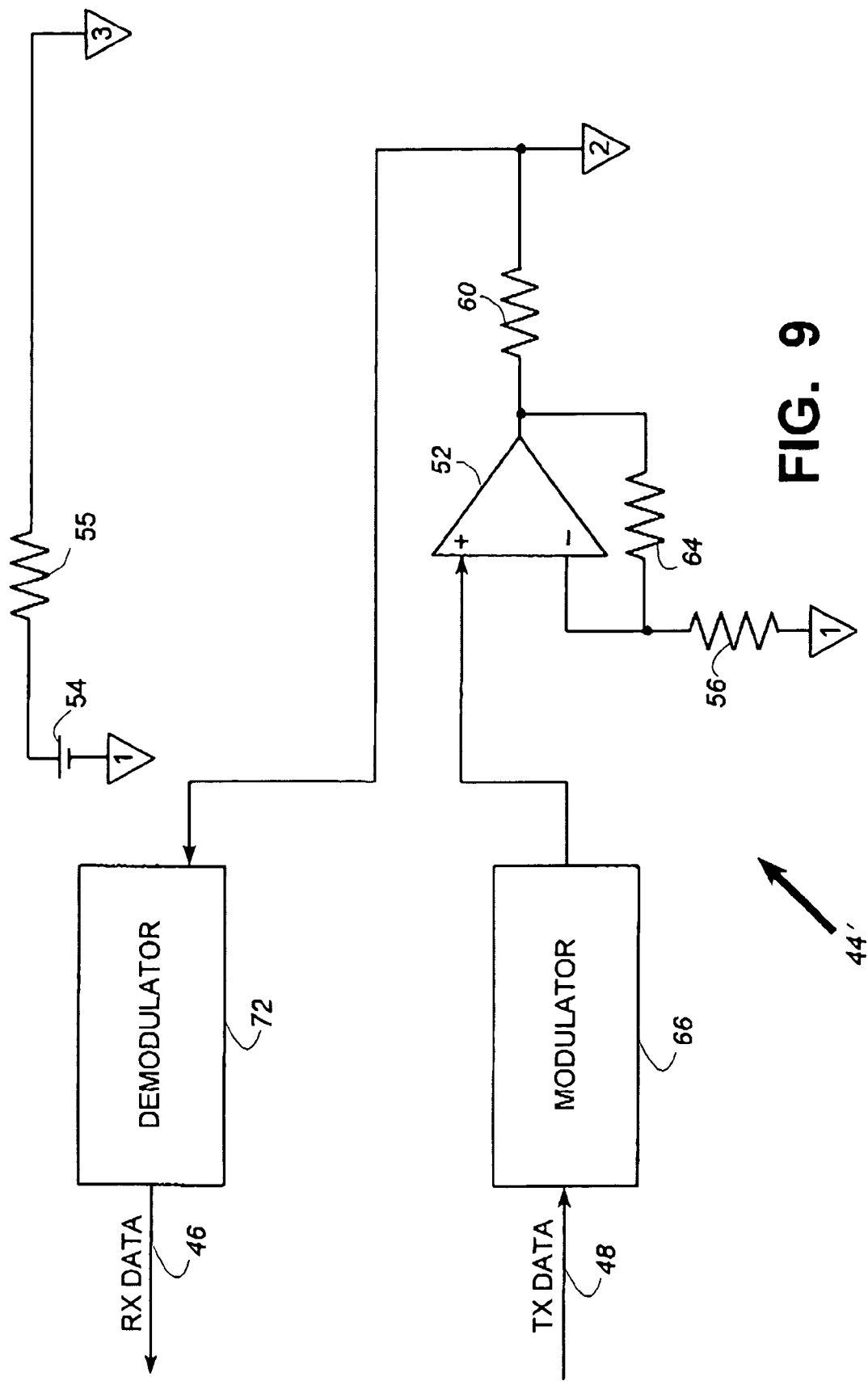
FIG. 9 illustrates a modified interface unit for the modified apparatus of FIG. 8.

As shown in more detail in FIG. 9, the modified interface unit 44' supplies power to the modified remote unit 34A' via grounds 1 and 3 and signalling via grounds 1 and 2. Thus, the modified interface unit 44' comprises a modulator 66 and demodulator 72 connected between data lines 48 and 46, respectively, and an amplifier 52. Amplifier 52 has its non-inverting input connected to the output of modulator 66 and its output connected to second ground 2 by a resistor 60. The input of demodulator 72 is connected to second ground 2. A feedback resistor 64 interconnects the output and inverting input of amplifier 52 and the inverting input is coupled to first ground 1 by resistor 56. The modulator 66, demodulator 72 and amplifier 52 operate in a similar manner to those shown in FIG. 2 to communicate signals between microcontroller 40 and remote unit 34A' via the transmission channel defined by grounds 1 and 2 and the loudspeaker conductors 26A(L1) and 26A(R1).

Power is supplied to the remote unit 34A' via first ground 1 and third ground 3 and conductors 26A (L1) and 26A(C1) by a separate power supply 68 which has its negative pole coupled to first ground 1 and its positive pole coupled to third ground 3 by way of a current limiting resistor 55.

Figure 10:
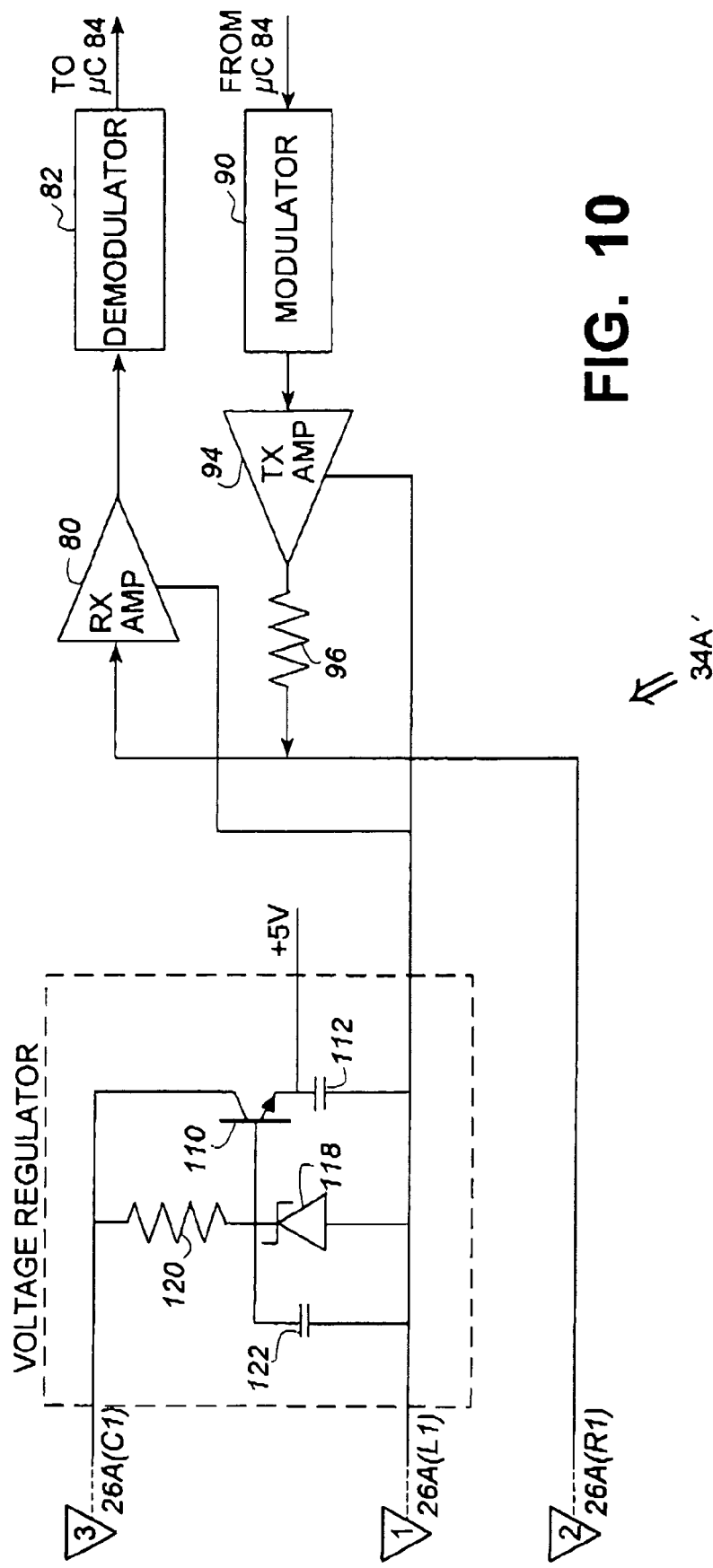
FIG. 10 illustrates modifications to a remote unit for use with the modified apparatus of FIG. 8.

FIG. 10 illustrates corresponding modifications to the remote unit 34A'. In particular, the voltage regulator comprises transistor 110, Zener diode 118, capacitors 122 and 112 and resistor 120, as in the voltage regulator of FIG. 4, but without the additional smoothing capacitor 116 and resistor 114. The backlight circuitry is not shown in FIG. 10 but would be similar to that shown in FIG. 4.

The receiver amplifier 80 and transmitter amplifier 94 have their ground terminals coupled to first ground 1 via conductor 26A(L1). The input of receiver amplifier 80 is connected to second ground 2 via conductor 26A(R1) and the output of transmitter amplifier 94 is connected by way of resistor 96 to second ground 2. Other components of remote unit 34A' will be configured in a similar manner to those of remote unit 34A (FIG. 3).

With such an arrangement, the transmission channel formed by conductors 26A(L1) and 26A(C1), between first ground 1 and third ground 3, is used to transfer power from the audio distribution unit 10 to the remote unit 34A' and the other transmission channel defined between conductors 26A(L1) and 26A(R1), first ground 1 and second ground 2, is used to transfer signals between the audio distribution unit 10 and the remote unit 34A'.

It should be appreciated that the intercom arrangement described as a modification with reference to FIGS. 1 to 5 could be adapted for use with the embodiment of FIG. 8.

It is also envisaged that, in any of the foregoing embodiments, each remote unit could provide an interface for an infrared remote control device. As illustrated in broken lines in FIG. 3, an infrared receiver 106, of the kind used in remote-controlled audio or video equipment, for receiving infrared signals transmitted by a separate infrared remote control device 107, may be coupled to the microcontroller 84 of remote unit 34A. The microcontroller 84 then would be programmed to transmit corresponding signals onto the signal transmission channel. At the audio distribution unit 10, the "infrared" data signals (or source control signals) would be demodulated and detected by the interface unit 44 along with other data signals from the remote units 34A-34D and passed to the microcontroller 40, which would supply corresponding source control signals to an infrared transmitter 101 (shown in broken lines in FIG. 1) for communicating with one or more of the various source components. In order to differentiate the source control or "infrared" data signals from other data signals, the microcontroller 84 in the remote unit would add an identifier to the source control signal, for example, several control bits. The microcontroller 40 would detect the infrared identifier in the received data signal RX and control the infrared transmitter 101 to generate a corresponding infrared control signal and broadcast it to the infrared receiver(s) on the front(s) of the source unit(s). It should be appreciated that the infrared signals could substitute for, or supplement, the other data signals.

Most infrared remote controls use ASK modulation. Consequently, where the remote unit is equipped with such an infrared receiver, the modulator could use ASK to transmit the signals from the infrared remote control device 107 for controlling the source unit (CD, tape, etc.) and use FSK to transmit the data signals for controlling operation of the audio distribution unit. The same demodulator could be used for both FSK and ASK. When the microcontroller 40 detected that the received signal was ASK modulated, it would pass it directly to the afore-mentioned infrared transmitter 101. If it detected that the signal was FSK modulated, however, the microcontroller 40 would determine the content of the signal and process it accordingly.

It should be appreciated that the infrared signals passed between the infrared remote control device 107 and the infrared receiver 106 need not be w identical to the infrared control signals passed between the infrared transmitter 101 and the audio source unit(s), so long as they convey the appropriate information. It would be convenient, of course, if they were substantially identical.

Figure 6:
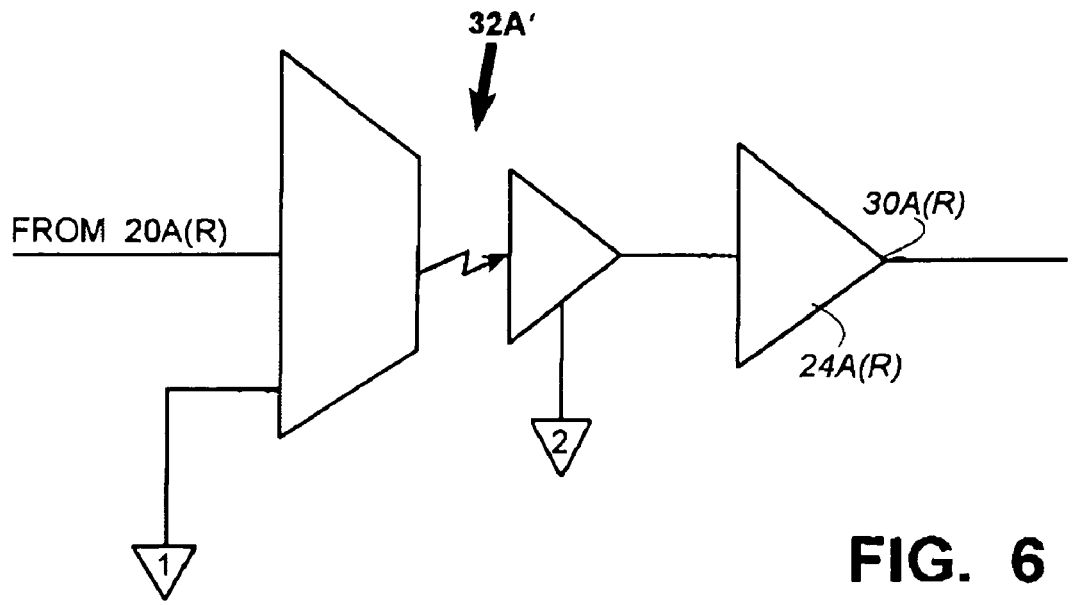
FIG. 6 illustrates an alternative coupling device for coupling audio signals in the audio distribution unit.

Various other modifications are envisaged. Thus, one or more of the differential amplifiers 32A-32D which allow the required referencing of the signal from terminal 20A(R) to the second ground 2 could be replaced by an isolation amplifier 32A' which, as shown in FIG. 6, would be connected in a similar manner to the differential amplifier 32A (FIG. 1) but would provide electrical isolation between its inputs and outputs, hence providing better common mode rejection. Suitable isolation amplifiers may use optical, magnetic, capacitive, or other suitable forms of isolation. It is also envisaged that a transformer could be used instead of the differential amplifier.

Where it is desired to use a larger potential difference than can be tolerated by the differential amplifier 32A, a capacitor could be interposed between the input of the differential amplifier 32A and the preamplifier unit 16.

If it is required to transmit power only, the differential amplifier 32A could be replaced by a suitable capacitor connected directly between the preamplifier output terminal 20A(R) and the input of power amplifier 24A(R). In the embodiment of FIG. 8, therefore, the second differential amplifier 32A(2) could be replaced by a suitable capacitor connected directly between the preamplifier output 20A(C) and the input of power amplifier 24A(C).

It would be possible for the microcontrollers 40 and 84 to perform the required modulation, in which case modulators 66 (FIG. 2) and 90 (FIG. 3) could be omitted. It is also envisaged that the power amplifier units 24A(L) . . . 24D(R) could be duplicate channels of a multi-channel power amplifier unit. The power amplifier units 24A(L) . . . 24D(R), the interface unit 44, the microcontroller 40, and the remote control units 34A-34D could be supplied to a customer without the preamplifier unit 16, for addition to an existing preamplifier unit capable of external control by microcontroller 40 or the like. The microcontroller 40 also could be omitted if the preamplifier unit 16 already had a microcontroller capable of interfacing with the interface unit 44.

Although the above-described embodiments transmit both power and signalling between the audio distribution unit 10 and the remote control units 34A-34D, the invention embraces systems which transmit power only, or signalling only. The appropriate components could then be omitted.

Although a four-zone audio system has been described, it will be appreciated that more zones could be added simply by adding loudspeaker sets and duplicating the power amplifier units; or fewer zones served with correspondingly fewer power amplifier units and loudspeaker sets. Appropriate modifications would, of course, be made to other components, such as the switching matrix and the programming of the microcontrollers 40 and 84.

It should be appreciated that, although an audio system has been described, specifically, the invention is applicable to audio-video systems, such as home theatre systems, which have sets of several loudspeakers in different zones. In such a case, the audio distribution unit 10 could be combined with a video distribution unit which itself might have several sources and a suitable switching matrix. The video sources also might be distributed. The same microcontroller might then control the audio and video distribution.

It should be noted that more than one remote control unit could be mapped to the same zone, for example a large room.

It should also be noted that a particular remote unit could be physically associated (co-located) with the loudspeakers of one zone, and associated logically by having an address linked to that zone by the microcontroller 40, yet be connected to the ground conductors of loudspeakers in a different zone.

For example, if two sets of audio transducers were located in adjacent rooms, the conductors from both sets of audio transducers might follow a common path back to the audio distribution unit, perhaps initially within a wall shared by the two rooms. In such a case, it might be convenient for both remote units to be connected to the same pair of grounded conductors and share the same transmission channel. The microcontroller 40 would be able to discriminate between their signals because each remote unit would include its own address with any signals it transmitted and detect its own address in the broadcast signals it received.

Although, in the above-described embodiments, each remote unit is connected to the loudspeaker terminals, each remote unit could be connected to the loudspeaker conductors anywhere along their length, or even be connected to the audio distribution unit by a pair of conductors of a multi-conductor cable, which were connected to the two grounds.

Figure 11:
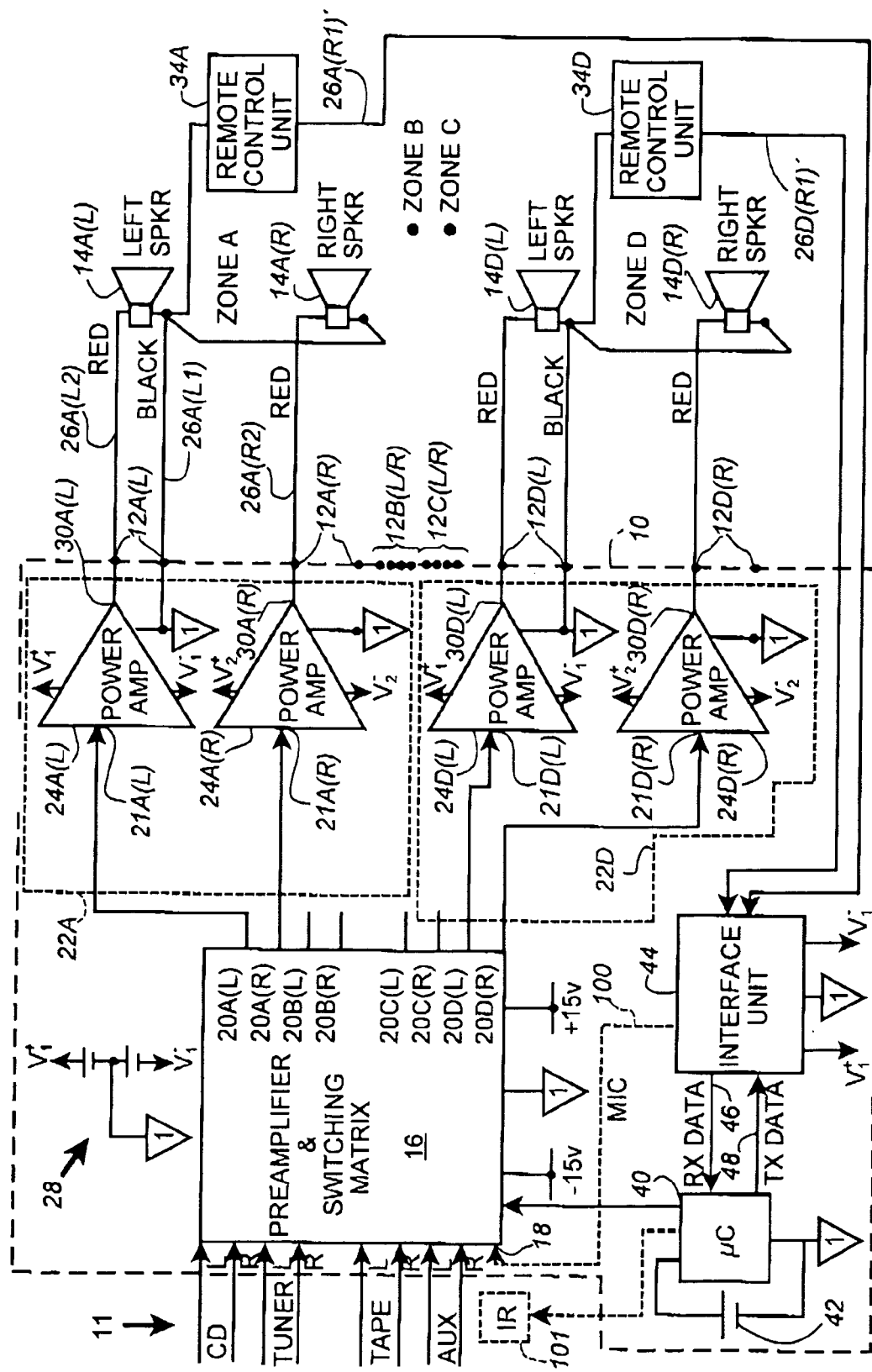
FIG. 11 illustrates a further embodiment of the invention in which two speakers and a remote control in a zone are connected to the audio unit by four conductors, one being a common ground conductor.

It is also envisaged that any of the foregoing embodiments of the invention could be modified so that two speakers and a remote unit in a zone shared four conductors, one of which connected the "ground" terminals of the remote unit and speakers to a common ground of the associated power amplifiers. Such an arrangement will now be described with reference to FIG. 11. The system shown in FIG. 11 is similar to that shown in FIG. 1 and corresponding components have the same reference number. The system of FIG. 11 differs from that of FIG. 1, however, as follows: (i) the power amplifiers 24A(L),24A(R), . . . ,24D(L),24D(R) share the same ground 1; (ii) the input terminals 21A(R), . . . ,21D(R) of the RIGHT channel power amplifiers 24A(R), . . . , 24D(R), respectively, are connected directly to output ports 20A(R), . . . ,20D(R), respectively, of the preamplifier unit 16; (iii) the second power supply unit 30 and ground 2 are omitted; (iv) both loudspeakers 14A(L) and 14A(R) have their BLACK terminals connected in common to the first conductor 26A(L1) and thereby to ground 1; (v) the terminal of remote unit 34A which, in the system of FIG. 1, would have been connected to the BLACK terminal of speaker 14A(R) is connected directly to the interface unit 44 by a conductor 26A(R1)'; (vi) in zone D, both loudspeakers 14D(L) and 14D(R) have their BLACK terminals connected in common to the conductor 26D(L1) and thereby to ground 1; (vii) the terminal of remote unit 34D which, in the system of FIG. 1, would have been connected to the BLACK terminal of speaker 14D(R) is connected directly to the interface unit 44 by a conductor 26D(R1)'. At the interface unit 44, the two conductors 26A(R1)' and 26D(R1)' are connected in common. The primes signify that, in a practical system, the conductors 26A(R1)' and 26D(R1)' would be the loudspeaker conductors 26A(R1) and 26D(R1) of FIG. 1 connected differently at their respective ends.

The other terminals of the remote units 34A and 34D are connected to respective BLACK terminals of the audio transducers 14A(L) and 14D(L), respectively, as in the embodiment of FIG. 1.

In this modified system, one of the usual four conductors used to connect the loudspeakers to the audio distribution unit 10, two conductors per loudspeaker, is reallocated. Thus, in zone A, the first conductor 26A(L1) serves to connect the BLACK terminals of both of the two loudspeakers 14A(L) and 14A(R) to the audio distribution unit ground 1, and the second and fourth conductors 26A(L2) and 26A(R2), with the first conductor, supply the RIGHT and LEFT channel audio signals to the LEFT and RIGHT loudspeakers, respectively. The third conductor 26A(R1)', and the first conductor 26A(L1) supply power to the remote unit 34A and communicate control signals to and from it. The speakers and remote units in the other zones are connected in a similar manner.

Generally, it is envisaged that, providing the distance between the loudspeakers and the audio distribution unit 10 is not too great, cross talk or reduction in stereo separation will not be unacceptable. Where the situation precludes it, perhaps because the distance is much greater, the embodiments which use separate grounds would be used instead.

Although the above-described embodiments have been shown, and described, with the audio distribution unit connected to the various sets of audio transducers, the invention comprehends audio distribution units and remote units supplied as a kit, without the audio transducers. Moreover, although the above-described embodiments have input means for receiving audio signals from separate sources, the input means could itself comprise one or more of such sources, for example as a tuner-amplifier unit with input ports for connecting to a tape deck, CD player, DVD player, and so on.

Although embodiments of the invention have been described and illustrated in detail, it is to be clearly understood that the same are by way of illustration and example only and not to be taken by way of limitation, the spirit and scope of the present invention being limited only by the appended claims.

What is claimed is:

1. Apparatus comprising an audio distribution unit (10) having means (11) for providing audio signals from audio sources and output ports (12A . . . 12D) for supplying sets of audio transducers, each said set comprising at least a first audio transducer (14A(L)) and a second audio transducer (14A(R)) and having associated therewith at least one remote unit (34A) for controlling the audio distribution unit by means of digital data signals, the first and second audio transducers (14A(L),14A(R)) and the remote unit (34A) being connected to the audio distribution unit (10) by a set of four conductors, the apparatus further comprising means (22A . . . 22D, 44, 76, 80-96) for supplying audio signals to each of the audio transducers (14A(L),14A(R)) by way of a respective pair of said four conductors and transferring power and said digital data signals between said audio distribution unit (10) and said remote unit (34A) by way of at least two of said four conductors.

2. Apparatus according to claim 1, wherein the remote unit (34A . . . 34D) comprises infrared receiver means (106) for receiving an infrared signal from a separate control unit (107) and transmitter means (84,90,94) for transmitting corresponding signals to the audio distribution unit (10), and the audio distribution unit comprises means for detecting said corresponding signals.

3. Apparatus according to claim 1, wherein the remote unit (34A . . . 34D) comprises voice circuitry (102) for converting signals from a microphone (96A) into voice signals for transmission to said audio distribution unit (10) and the audio distribution unit (10) further comprises means 16) for relaying the voice signals to one or more of said sets of audio transducer units.

4. Apparatus comprising an audio distribution unit (10) having means (11) for providing audio signals from audio sources and output ports (12A . . . 12D) for supplying sets of audio transducers, each said set comprising at least a first audio transducer (14A(L)) and a second audio transducer (14A(R)) and having associated therewith at least one remote unit (34A), the first and second audio transducers (14A(L),14A(R)) and the remote unit (34A) being connected to the audio distribution unit (10) by a set of four conductors, the apparatus further comprising means (22A . . . 22D,44,76,80-96) for supplying audio signals to the audio transducers (14A(L),14A(R)) and transferring at least one of power and data signals between said audio distribution unit (10) and said remote unit (34A), all by way of the four conductors, wherein the audio distribution unit (10) comprises first and second power amplifiers (24A(L),24A(R)), a first conductor (26A(L1)) connects one terminal of each of said first and second audio transducers (14A(L),14A(R)) and one terminal of the remote unit (34A) to a ground terminal of the audio distribution unit (10), a second (26A(L2)) of the conductors connects a drive signal terminal of said first audio transducer (14A(L)) to a corresponding output terminal (30A(L)) of said first power amplifier (24A(L)), a third conductor (26A(1)) connects a second terminal of the remote unit (34A) to an interface unit (44) of the audio distribution unit (10), and a fourth conductor (26A(R2)) connects a drive-signal terminal of said second audio transducer (14A(R)) to a corresponding output terminal (30A(R)) of said second power amplifier (24A(R)), the audio signals being supplied by way of the first second and fourth conductors and the at least one of power and data signals being transferred by way of the first and third conductors.

5. Apparatus according to claim 4, wherein the remote unit (34A . . . 34D) comprises infrared receiver means (106) for receiving an infrared signal from a separate control unit (107) and transmitter means (84,90,94) for transmitting corresponding signals to the audio distribution unit (10), and the audio distribution unit comprises means for detecting said corresponding signals.

6. Apparatus according to claim 4, wherein the remote unit (34A . . . 34D) comprises voice circuitry (102) for converting signals from a microphone (96A) into voice signals for transmission to said audio distribution unit (10) and the audio distribution unit (10) further comprises means (16) for relaying the voice signals to one or more of said sets of audio transducer units.

7. Apparatus comprising an audio distribution unit (10) having means (11) for providing audio signals from audio sources and output ports (12A . . . 12D) for supplying sets of audio transducers, each said set comprising at least a first audio transducer (14A(L)) and a second audio transducer (14A(R)) and having associated therewith at least one remote unit (34A), the first and second audio transducers (14A(L),14A(R)) and the remote unit (34A) being connected to the audio distribution unit (10) by a set of four conductors, the apparatus further comprising means (22A . . . 22D,44,76,80-96) for supplying audio signals to the audio transducers (14A(L),14A(R)) and transferring at least one of power and data signals between said audio distribution unit (10) and said remote unit (34A), all by way of the four conductors, wherein the audio distribution unit (10) comprises first and second power amplifiers (24A(L),24A(R)) each connected to a respective one of two grounds (1,2) that are separated electrically from each other, a first conductor (26A(L1)) connects one drive-signal terminal of the first audio transducer (14A(L)) to a ground terminal of the first power amplifier (24A(L)), a second conductor (26A(L2)) connects the other drive-signal terminal of the first audio transducer (14A(L)) to an output terminal (30A(L)) of the first power amplifier (24A(L)), a third conductor (26A(R1)) connects one terminal of the second audio transducer (14A(R)) to a ground terminal of the second power amplifier (24A(R)), and a fourth conductor (26A(R2)) connects the other drive-signal terminal of the second audio transducer (14A(R)) to a corresponding output terminal (30A(R)) of the second power amplifier (24A(R)), the audio signals being supplied to the first audio transducer (14A(L)) by way of the first and second conductors, and to the second audio transducer (14A(R)) by way of the third and fourth conductors, and said at least one of power and data signals being transferred by way of the first (26A(L1)) and third (26A(R1)) conductors.

8. Apparatus according to claim 7, wherein the remote unit (34A . . . 34D) comprises infrared receiver means (106) for receiving an infrared signal from a separate control unit (107) and transmitter means (84,90,94) for transmitting corresponding signals to the audio distribution unit (10), and the audio distribution unit comprises means for detecting said corresponding signals.

9. Apparatus according to claim 7, wherein the remote unit (34A . . . 34D) comprises voice circuitry (102) for converting signals from a microphone (96A) into voice signals for transmission to said audio distribution unit (10) and the audio distribution unit (10) further comprises means (16) for relaying the voice signals to one or more of said sets of audio transducer units.

10. Apparatus comprising an audio distribution unit (10) having means (11) for providing audio signals from audio sources and output ports (12A . . . 12D) each having a line terminal and a ground terminal, at least one set of audio transducers, said set comprising at least a first audio transducer (14A(L)) and a second audio transducer (14A(R)) connected to a respective set (12A(L), 12A(R)) of said output ports by a set of conductors comprising a first conductor (26A(L1)), a second conductor (26A(L2)), a third conductor (26A(R1)) and a fourth conductor (26A(R2)), said apparatus further comprising at least one remote unit (34A) associated with said set of audio transducers, wherein the audio distribution unit (10) has a first ground (1) and a separate second ground (2), said set of output ports including a first output port (12A(L)) and a second output port (12A(R)) connected to the first ground (1) and second ground (2), respectively, said first conductor (26A(L1)) and said second conductor (26A(L2)) connecting respective drive-signal terminals of said first audio transducer (14A(L)) to the ground terminal and line terminal, respectively, of said first output port (12A(L)), and said third conductor (26A(R1)) and said fourth conductor (26A(2)) connecting respective drive signal terminals of said second audio transducer (14A(R)) to the ground terminal and line terminal, respectively, of said second output port (12A(R)), the remote unit (34A) being connected to said first ground (1) and said second ground (2), the apparatus further comprising means (22A . . . 22D,44,76,80-96) for transferring at least one of power and data signals between said audio distribution unit (10) and said remote unit (34A) by way of said first ground (1) and said second ground (2).

11. Apparatus according to claim 10, wherein the remote unit (34A) is connected to the first ground (1) and second ground (2) by the first conductor (26A(L1)) and the third conductor (26A(R1)), respectively, the power or data signals being transferred by way of these first and second conductors.

12. Apparatus according to claim 10, wherein the remote unit (34A) is connected to said first ground (1) and said second ground (2) by conductors other than the conductors connected to the drive signal terminals of the audio transducers (26A(L1),26A(L2),26A(R1),26A(R2)).

13. Apparatus according to claim 10, comprising a plurality of said sets of at least two audio transducers (14A(L), 14A(R), . . . 14D(L),14D(R)) connected to a corresponding plurality of sets of said output ports, and a corresponding plurality of remote units (34A . . . 34D), each remote unit being connected to said first ground (1) and second ground (2) and associated with a respective one of the sets of audio transducers, and wherein the transferring means (44,76,80-96) comprises, at each of said remote units (34A-34D), means (84,90,94) for transmitting to said audio distribution unit (10) data signals including an identifier specific to the set of audio transducers with which that remote unit is associated and, at the audio distribution unit (10), means (40,44) for receiving said data signals and using said identifier to identify the remote unit, whereby the data signal was transmitted.

14. Apparatus according to claim 10, comprising a plurality of said sets of audio transducers (14A(L),14A(R), . . . 14D(L),14D(R)) connected to a plurality of said sets of output ports (12A . . . 12D) by a plurality of said sets of conductors, and a corresponding plurality of said remote units (34A, . . . 34D), connected to said first ground (1) and second ground (2), wherein at least one of said remote units (34A, . . . 34D) is co-located with one of said sets of audio transducers and connected to the first ground (1) and the second ground (2) by one or more conductors of a said set of conductors connecting a different set of audio transducer units (14A, . . . 14D) to the audio distribution unit (10) and the transferring means (44,76,80-96) comprises, at each of said remote units (34A-34D), means (84,90,94) for transmitting to said audio distribution unit (10) data signals each including an identifier specific to the set of audio transducers with which that remote unit is associated and, at the audio distribution unit (10), means (40,44) for receiving said data signals and using said identifier to identify the transmitting remote unit.

15. Apparatus according to claim 10, wherein the audio distribution unit (10) has a third ground (3) separate from both of the first ground (1) and the second ground (2), said set of output ports includes a third output port (12A(C)), said at least one set of audio transducers (14A(L),14A(R)) comprises a third audio transducer (14A(C)) and said set of conductors further comprises a fifth conductor (26A(C1)) and a sixth conductor (26A(C2)) connecting drive terminals of said third audio transducer (14A(C)) to ground and line terminals, respectively, of said third output port (30A(C)), the remote unit (34A) is connected also to the third ground (3), and the transferring means (44,76,80-96) is connected to the first, second and third grounds (1,2,3) for transference of power to the remote unit (34A) via one pair of the three grounds and transference of said data signals via a different pair of the three grounds (1,2,3).

16. Apparatus according to claim 10, wherein there is provided at least a second set of audio transducers (14B(L), 14B(R)) connected to the audio distribution unit (10) by a second set of conductors and a second remote unit (34B) associated therewith, and the audio distribution unit (10) has a third ground (3) separate from the first ground (1) and second ground (2) and a second set of said output ports (12B(L), 12B(R)) each having a ground terminal and a line terminal, the second set of output ports included one port (12B(L)) with its ground terminal connected to the ground (1) and another port (12B(R)) with its terminal connected to the third ground (3), drive terminals of one of the audio transducers (14B(L)) of the second set of audio transducers being connected to said one port (12B(L)) and drive terminals of a second audio transducer (14B(R)) of said second set being connected to said another output port (12B(R)), and wherein the transferring means (44,44/2,76,80-96) is connected also between said first ground (1) and said third ground (3) for transferring either or both of power and data signals also between said audio distribution unit (10) and said second remote unit (34B), the apparatus further comprising means (40) for determining the set of audio transducers to which a particular one of said data signals relates.

17. Apparatus according to claim 16, wherein the transferring means (44,44/2) is coupled to the first and second sets of audio transducers, respectively, and to the first, second and third grounds (1,2,3) the determining means (40) determining the set of audio transducers according to the interface unit whereby the data signal is communicated,.

18. Apparatus according to claim 10, wherein the transferring means comprises, at the or each remote unit (34A-34D), transmitter means (84,90,94) coupled to the grounds for transmitting said data signals to the audio distribution unit (10) and, at the audio distribution unit (10), receiver means (72) coupled to said grounds for receiving said data signals and means (40) responsive to said data signals for controlling operation of said audio distribution unit (10) in dependence thereupon.

19. Apparatus according to claim 10, wherein the transferring means (44,76,80-96) comprises, at the audio distribution unit (10) transmitter means (50,66) for transmitting data signals via said grounds and the or each remote unit (34A . . . 34D) further comprises corresponding receiver means (82) connected between the said grounds for receiving said data signals.

20. Apparatus according to claim 10, wherein said transferring means (44,76,80-96) comprises means (50,54) for establishing a potential difference between the pair of grounds used for power transfer and the remote unit (34A . . . 34D) comprises means (76) coupled to the grounds for extracting power therefrom.

21. Apparatus according to claim 10, wherein the audio distribution unit (10) comprises a preamplifier unit (16) and one or more power amplifier units (22A . . . 22D), each connected to a corresponding set of audio transducers by way of the corresponding set of output ports 12A . . . 12D, the or each audio power amplifier unit 22A . . . 22D comprising a first power amplifier (24A(L) . . . 24D(L)), a second power amplifier (24A(R) . . . 24D(R)) and a coupling device (32A . . . 32D), the first power amplifier (24A(L) . . . 24D(L)) having a ground terminal and an output terminal connected to, respectively, the ground terminal and line terminal of one (12A(L) . . . 12D(L)) of the set of output ports, the ground terminal being connected also to said first ground (1), and an input terminal (21A(L) . . . 21D(L)) connected to a first audio output port (20A(L) . . . 20D(L)) of the preamplifier unit (16), the second power amplifier (24A(R) . . . 24D(R)) having a ground terminal and an output terminal connected to, respectively, the ground terminal and line terminal of another (12A(R) . . . 12D(R)) of the set of output ports, said coupling device (32A . . . 32D) connecting a second audio output port (20A(R) . . . 20D(R)) of the preamplifier (16) to an input (21A(R) . . . 21D(R)) of the second power amplifier (24A(R) . . . 24D(R)).

22. Apparatus according to claim 21, wherein the or each coupling device (32A . . . 32D) comprises a differential amplifier having a signal output terminal and an output ground terminal connected to, respectively, an input (21A(R) . . . 21D(R)) of the second power amplifier (24A(R) . . . 24D(R)) and said second ground (2), a first input terminal connected to said first ground (1), and a second input terminal connected to said second audio output port (20A(R) . . . 20D(R)) of the preamplifier unit (16).

23. Apparatus according to claim 21, wherein the or each coupling device (32A) comprises an isolation amplifier having an input connected to said second audio output port (20A(R)) of the preamplifier unit (16), and an output connected to an input (21A(R)) of the second power amplifier (24A(R)).

24. Apparatus according to claim 21, wherein the coupling device (32A) comprises a capacitor connected between said second audio output port (20A(R)) of the preamplifier unit (16) and an input of the second power amplifier (24A(R)).

25. Apparatus according to claim 10, wherein the remote unit (34A . . . 34D) comprises infrared receiver means (106) for receiving an infrared signal from a separate control unit (107) and transmitter means (84,90,94) for transmitting corresponding signals via said grounds, and the audio distribution unit comprises means for detecting said corresponding signals.

26. Apparatus according to claim 10, wherein the remote unit (34A . . . 34D) comprises voice circuitry (102) for converting signals from a microphone (96A) into voice signals for transmission to said audio distribution unit (10) and the audio distribution unit (10) further comprises means (16) for relaying the voice signals to one or more of said sets of audio transducer units.

27. Apparatus according to claim 26, wherein the remote unit (34A) includes means (84,90,94) for associating with the voice signal an address of said remote unit (34A) and the audio distribution unit (10) comprises means (40,16) for detecting said address and broadcasting the voice signals to audio transducer sets other than that from which the voice signals originated.

28. Apparatus according to claim 26, wherein the remote unit further comprises means (84,90,94) for associating with the voice signals an address of a recipient set of audio transducers to which the voice signals are to be sent, and the audio distribution unit (10) comprises means (40,16) for detecting the address and controlling the audio distribution unit to transmit the voice signal to the recipient set of audio transducers.

29. Apparatus according to claim 20, wherein the means (76) for extracting power comprises means response to a voice control signal for modulating at least a part of the power extracted for the remote unit, the power transfer means at the audio distribution unit (10) comprises a constant current source and the audio distribution unit further comprises means for detecting the modulation as a corresponding fluctuation of a potential difference between said grounds to recover the voice signals and relaying the voice signals to one or more of said sets of audio transducer units, the remote unit further comprising voice circuitry (102) for converting signals from a microphone (96A) to produce said voice control signal.

30. Apparatus according to claim 29, wherein the remote unit has a backlight supplied with current by the power extraction unit and the power modulating means modulates the backlight current with the voice control signal.

31. Apparatus according to claim 10, further comprising an infrared transmitter coupled to the audio distribution unit for transmitting infrared control signals for controlling one of the audio sources, and wherein the remote unit comprises a receiver for receiving, from an infrared remote control device, infrared signals corresponding to said infrared control signals, generating in response thereto corresponding source control signals, and transmitting the source control signals to the audio distribution unit, the audio distribution unit having means for detecting said source control signals and controlling the infrared transmitter in dependence thereupon to generate said infrared control signals.

32. Apparatus according to claim 31, wherein said means for transmitting said data signals and said means for transmitting the source control signals transmit their respective signals via the same transmission path but each using a different form of modulation.

33. Apparatus according to claim 32, wherein the means for transmitting the source control signals uses amplitude shift keying (ASK) and the means for transmitting the data signals uses frequency shift keying (FSK).

34. An audio distribution unit (10) for the apparatus of claim 10 and having means (11) for providing audio signals from audio sources, a first ground (1), a separate second ground (2), at least one set of output ports (12A . . . 12D) each having a line terminal and a ground terminal, said set of output ports including a first output port (12A(L) and a second output port (12A(R)), each having a line terminal and a ground terminal, having their respective ground terminals connected to the first ground (1) and second ground (2), respectively, and their line terminals for connection to a first and a second, respectively, of a corresponding set of audio transducers, and means (44) for transferring by way of said first ground (1) and said second ground (2) and said first and second output ports at least one of power and data signals between said audio distribution unit (10) and a remote unit (34A) associated with said set of audio transducers.

35. An audio distribution unit according to claim 34, for use with a plurality of said sets of at least two audio transducers (14A(L),14A(R), . . . 14D(L),14D(R)) connected to a corresponding plurality of sets of said output ports, and a corresponding plurality of remote units (34A . . . 34D), each remote unit being connected to said first ground (1) and second ground (2) and associated with a respective one of the sets of audio transducers, the transferring means (76,80-96) at each of said remote units (34A-34D) comprising means (84,90,94) for transmitting to said audio distribution unit (10) data signals including an identifier specific to the set of audio transducers with which that remote unit is associated, the audio distribution unit (10) further comprising means (40,44) for receiving said data signals and using said identifier to identify the remote unit whereby the data signal was transmitted.

36. An audio distribution unit according to claim 35, for use in apparatus according to claim 14, further comprising means (40,44) for receiving said data signals and using said identifier to identify the transmitting remote unit.

37. An audio distribution unit according to claim 34, for use in the apparatus according to claim 15, further comprising a third ground (3) separate from both of the first ground (1) and the second ground (2), and wherein said set of output ports includes a third output port (12A(C)), and the transferring means (44) is connected to the first, second and third grounds (1,2,3) for transference of power to the remote unit (34A) via one pair of the three grounds and transference of said data signals via a different pair of the three grounds (1,2,3).

38. An audio distribution unit according to claim 34, for use in apparatus according to claim 16, further comprising a third ground (3) separate from the first ground (1) and second ground (2) and further comprising a second set of said output ports (12B(L), 12B(R)) each having a ground terminal and a line terminal, the second set of output ports included one port (12B(L)) with its ground terminal connected to the first ground (1) and another port (12B(R)) with its ground terminal connected to the third ground (3), drive terminals of one of the audio transducers (14B(L)) of the second set of audio transducers being connected to said one port (12B(L)) and drive terminals of a second audio transducer (14B(R)) of said second set being connected to said another output port (12B(R)), and wherein the transferring means (44,44/2) is connected also between said first ground (1) and said third ground (3) for transferring either or both of power and data signals also between said audio distribution unit (10) and said second remote unit (34B), the audio distribution unit further comprising means (40) for determining the set of audio transducers to which a particular one of said data signals relates.

39. An audio distribution unit according to claim 38, for use in apparatus according to claim 16, wherein the transferring means (44,44/2) comprises a first interface unit and a second interface unit coupled to the first and second sets of output ports, respectively, and to different pairs of the first, second and third grounds (1,2,3), the determining means (40) determining the set of audio transducers according to the interface unit whereby the data signal is communicated.

40. An audio distribution unit according to claim 34, for use in apparatus according to claim 18, further comprising receiver means (72) coupled to said grounds for receiving said data signals and means (40) responsive to said data signals for controlling operation of said audio distribution unit (10) in dependence thereupon.

41. An audio distribution unit according to claim 34, for use in apparatus according to claim 19, wherein the transferring means (44) comprises transmitter means (50,66) for transmitting data signals via said grounds.

42. An audio distribution unit according to claim 34, for use in apparatus according to claim 20, wherein said transferring means (44) comprises means (54) for establishing a potential difference between the pair of grounds used for power transfer.

43. An audio distribution unit according to claim 34, for use in apparatus according to claim 21, further comprising a preamplifier unit (16) and one or more power amplifier units (22A . . . 22D), each connected to a corresponding set of audio transducers by way of the corresponding set of output ports (12A . . . 12D), the or each audio power amplifier unit (22A . . . 22D) comprising a first power amplifier (24A(L) . . . 24D(L)), a second power amplifier (24A(R)) . . . 24D(R)) and a coupling device (32A . . . 32D), the first power amplifier (24A(L) . . . 24D(L)) having a ground terminal and an output terminal connected to, respectively, the ground terminal and line terminal of one (12A(L) . . . 12D(L)) of the set of output ports, the ground terminal being connected also to said first ground (1), and an input terminal (21A(L) . . . 21D(L)) connected to a first audio output port (20A(L) . . . 20D(L)) of the preamplifier unit (16), the second power amplifier (24A(R) . . . 24D(R)) having a ground terminal and an output terminal connected to, respectively, the ground terminal and line terminal of another (12A(R) . . . 12D(R)) of the set of output ports, said coupling device (32A . . . 32D) connecting a second audio output port (20A(R) . . . 20D(R)) of the preamplifier (16) to an input (22A(R) . . . 22D(R) of the second power amplifier (24A(R) . . . 24D(R)).

44. An audio distribution unit according to claim 43, for use in apparatus according to claim 22, wherein the or each coupling device (32A . . . 32D) comprises a differential amplifier having a signal output terminal and an output ground terminal connected to, respectively, an input (22A(R) . . . 22D(R)) of the second power amplifier (24A(R) . . . 24D(R)) and said second ground (2), a first input terminal connected to said first ground (1), and a second input terminal connected to said second audio output port (20A(R) . . . 20D(R)) of the preamplifier unit (16).

45. An audio distribution unit according to claim 43, for use in apparatus according to claim 23, wherein the or each coupling device (32A) comprises an isolation amplifier having an input connected to said second audio output port (20A(R)) of the preamplifier unit (16), and an output connected to an input (22A(R) of the second power amplifier (24A(R).

46. An audio distribution unit according to claim 43, for use in apparatus according to claim 24, wherein the coupling device (32A) comprises a capacitor connected between said second audio output port (20A(R)) of the preamplifier unit (16) and an input of the second power amplifier (24A(R)).

47. An audio distribution unit according to claim 34, for use in apparatus according to claim 25, and comprising means for detecting, between said grounds, signals corresponding to infrared signals received by the remote unit.

48. An audio distribution unit according to claim 35, for use in apparatus according to claim 26, further comprises means (16) for relaying the voice signals to one or more of said sets of output ports for said audio transducer units.

49. An audio distribution unit according to claim 48, for use in apparatus according to claim 27, further comprising means for detecting said address and broadcasting the voice signals to audio transducer sets other than that from which the voice signals originated.

50. An audio distribution unit according to claim 48, for use in apparatus according to claim 28, further comprising means (40,16) for detecting the address and controlling the audio distribution unit to transmit the voice signal to the recipient set of audio transducers.

51. An audio distribution unit according to claim 42, for use in apparatus according to claim 29, wherein the power transfer means (10) comprises a constant current source and the audio distribution unit further comprises means (40,16) for detecting the modulation as a corresponding fluctuation of a potential difference between said grounds to recover the voice signals and relaying the voice signals to one or more of said sets of output ports for the audio transducer units.

52. An audio distribution unit according to claim 34, in an assemblage with one or more of said remote units.

53. Apparatus according to claim 34, wherein the remote unit (34A . . . 34D) comprises infrared receiver means (106) for receiving an infrared signal from a separate control unit (107) and transmitter means (84,90,94) for transmitting corresponding signals to the audio distribution unit (10), and the audio distribution unit comprises means for detecting said corresponding signals.

54. Apparatus according to claim 34, wherein the remote unit (34A . . . 34D) comprises voice circuitry (102) for converting signals from a microphone (96A) into voice signals for transmission to said audio distribution unit (10) and the audio distribution unit (10) further comprises means (16) for relaying the voice signals to one or more of said sets of audio transducer units.

55. Apparatus according to claim 10, wherein the remote unit (34A . . . 34D) comprises infrared receiver means (106) for receiving an infrared signal from a separate control unit (107) and transmitter means (84,90,94) for transmitting corresponding signals to the audio distribution unit (10), and the audio distribution unit comprises means for detecting said corresponding signals.

56. Apparatus according to claim 10, wherein the remote unit (34A . . . 34D) comprises voice circuitry (102) for converting signals from a microphone (96A) into voice signals for transmission to said audio distribution unit (10) and the audio distribution unit (10) further comprises means (16) for relaying the voice signals to one or more of said sets of audio transducer units.

* * * * *